(12) United States Patent
Sasaki et al.

(10) Patent No.: US 9,400,421 B2
(45) Date of Patent: Jul. 26, 2016

(54) MASK BLANK SUBSTRATE, MASK BLANK, REFLECTIVE MASK BLANK, TRANSFER MASK, REFLECTIVE MASK, AND METHODS OF MANUFACTURING THE SAME

(75) Inventors: Tatsuya Sasaki, Tokyo (JP); Takahito Nishimura, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 428 days.

(21) Appl. No.: 14/118,479

(22) PCT Filed: May 15, 2012

(86) PCT No.: PCT/JP2012/062373
§ 371 (c)(1),
(2), (4) Date: Apr. 15, 2014

(87) PCT Pub. No.: WO2012/157629
PCT Pub. Date: Nov. 22, 2012

(65) Prior Publication Data
US 2014/0234755 A1 Aug. 21, 2014

(30) Foreign Application Priority Data
May 19, 2011 (JP) .................................. 2011-112185

(51) Int. Cl.
| G03F 1/24 | (2012.01) |
| B32B 3/02 | (2006.01) |
| G03F 1/38 | (2012.01) |
| G03F 1/60 | (2012.01) |
| G03F 1/22 | (2012.01) |

(52) U.S. Cl.
CPC ... G03F 1/24 (2013.01); B32B 3/02 (2013.01); G03F 1/22 (2013.01); G03F 1/38 (2013.01); G03F 1/60 (2013.01); *Y10T 428/24488* (2015.01)

(58) Field of Classification Search
CPC ................ G03F 1/24; G03F 1/22; B32B 3/02
USPC .............................................................. 430/5
See application file for complete search history.

(56) References Cited

U.S. PATENT DOCUMENTS

| 2004/0035153 A1 | 2/2004 | Koike et al. |
| 2004/0192063 A1 | 9/2004 | Koike |
| 2004/0248017 A1 | 12/2004 | Ohtaguro et al. |
| 2006/0057474 A1 | 3/2006 | Koike et al. |

(Continued)

FOREIGN PATENT DOCUMENTS

| JP | 2000-356849 A | 12/2000 |
| JP | 2004-98278 A | 4/2004 |

(Continued)

OTHER PUBLICATIONS

Search Report dated Jan. 20, 2016, issued by the Taiwan Patent Office in corresponding Taiwanese Application No. 101117691.

(Continued)

*Primary Examiner* — Stephen Rosasco
(74) *Attorney, Agent, or Firm* — Sughrue Mion, PLLC

(57) ABSTRACT

A mask blank substrate is provided with a substrate mark comprising an oblique section. The inclination angle of the substrate mark with respect to a main surface is greater than 45° and less than 90° and the distance from the boundary between the main surface and the substrate mark to the outer periphery of the mask blank substrate is less than 1.5 mm.

26 Claims, 8 Drawing Sheets

(56) References Cited

U.S. PATENT DOCUMENTS

2006/0223224 A1* 10/2006 Akagawa ............... G03F 1/60
438/106
2009/0325083 A1 12/2009 Okubo et al.

FOREIGN PATENT DOCUMENTS

| | | |
|---|---|---|
| JP | 2005-221705 A | 8/2005 |
| JP | 2006-78991 A | 3/2006 |
| JP | 2007057638 A | 3/2007 |
| JP | 2004-310067 A | 11/2013 |
| JP | 2010008738 A | 1/2014 |
| TW | 200424751 A | 11/2004 |
| TW | 200506508 A | 2/2005 |

OTHER PUBLICATIONS

International Search Report of PCT/JP2012/062373 dated Aug. 21, 2012.

* cited by examiner

MASK BLANK SUBSTRATE, MASK BLANK, REFLECTIVE MASK BLANK, TRANSFER MASK, REFLECTIVE MASK, AND METHODS OF MANUFACTURING THE SAME

This is a National Stage of International Application No. PCT/JP2012/062373 filed May 15, 2012, claiming priority based on Japanese Patent Application No. 2011-112185 filed May 19, 2011, the contents of all of which are incorporated herein by reference in their entirety.

TECHNICAL FIELD

This invention relates to a mask blank substrate, a mask blank, a reflective mask blank, a transfer mask, a reflective mask, and methods of manufacturing them.

BACKGROUND ART

In recent years, there has been a tendency that, with the increase in the density and accuracy of ultra-LSI devices, the requirement for an increase in the fineness and flatness of a substrate surface required for a mask blank substrate, a mask blank, a transfer mask, or the like for use in the manufacture of ultra-LSI devices has become severe more and more year by year. In particular, as the wavelength of an exposure light source has been shortened, the requirement for the shape accuracy (flatness) and quality (defect size) of a substrate surface has become severe more and more, and accordingly, there has been required a mask blank substrate or the like with extremely high flatness and with no microdefects. In the case of a mask blank substrate for use in a reflective mask adapted to reflect exposure light, the requirement for the shape accuracy and quality of a substrate surface is particularly severe.

In order to respond to the above-mentioned requirement, various techniques have been developed.

For example, Patent Document 1 discloses a mask blank glass substrate manufacturing method which comprises a polishing process of polishing a surface of a mask blank glass substrate (also called a mask blank substrate) using a polishing liquid containing polishing abrasive particles.

This technique is characterized in that the polishing abrasive particles contain colloidal silica abrasive particles produced by hydrolyzing an organic silicon compound and that the polishing liquid contains the colloidal silica abrasive particles and is neutral.

Patent Document 2 discloses a technique for a mask blank glass substrate manufacturing method which comprises a concave-convex shape measurement process of measuring the concave-convex shape of a surface of a mask blank glass substrate, a flatness control process of specifying the convex degree of a convex portion present on the glass substrate surface based on measurement results obtained in the concave-convex shape measurement process and applying local processing to the convex portion under processing conditions according to the convex degree to thereby control the flatness of the glass substrate surface to a predetermined reference value or less, and a polishing process, after the flatness control process, of polishing the glass substrate surface subjected to the local processing. This technique is a method that applies an acid treatment to the glass substrate surface subjected to the local processing, after the flatness control process and before the polishing process.

The technique of the Patent Document 2 comprises the concave-convex shape measurement process, the flatness control process, and so on and comprises a preparation process before the concave-convex shape measurement process. This preparation process comprises at least a rough polishing process of roughly polishing both surfaces of the mask blank substrate and a precision polishing process of precisely polishing both surfaces of the mask blank substrate roughly polished, thereby carrying out polishing stepwise. In this event, for example, the rough polishing process uses a polishing liquid containing relatively large polishing abrasive particles of cerium oxide while the precision polishing process uses a polishing liquid containing relatively small polishing abrasive particles of colloidal silica.

On the other hand, conventionally, in a mask blank substrate, in order to make it possible to judge the kind of substrate or distinguish between the front and back of the substrate, use has been made of a substrate mark (or also called a notch mark) formed by cutting a main surface into the shape of an oblique section at a corner (also called a corner) of the rectangular mask blank substrate.

Various techniques related to the above-mentioned substrate mark have been developed.

For example, Patent Document 3 discloses a technique for a mask blank transparent substrate which is required to have predetermined optical properties and is characterized by having a substrate mark formed by cutting a predetermined corner portion into the shape of an oblique section, wherein this shape is determined according to the optical properties.

Patent Document 4 discloses a technique for a photomask substrate with a generally rectangular shape, which is characterized by having at least one notch mark formed by cutting, at a corner of such a rectangular shape, three surfaces, i.e. a main surface and two end faces forming such a corner, into the shape of an oblique section, wherein the notch mark has an asymmetrical shape with respect to a diagonal, including such a corner, of the photomask substrate.

PRIOR ART DOCUMENT

Patent Document

Patent Document 1: JP-A-2004-98278
Patent Document 2: JP-A-2004-310067
Patent Document 3: JP-A-2006-78991
Patent Document 4: JP-A-2000-356849

SUMMARY OF THE INVENTION

Problem to be Solved by the Invention

Conventionally, as described in paragraph 0004 of the Patent Document 4, it has been considered that a substrate mark "does not directly affect the quality of a mask substrate". However, the present inventors have found out a novel fact in the study of improving the flatness of a mask blank substrate that a substrate mark comprising an oblique section adversely affects the flatness during polishing.

Specifically, the present inventors have carried out a rough polishing process, a precision polishing process, and an ultra-precision polishing process using a polishing liquid containing colloidal silica with respect to a mask blank substrate formed with a substrate mark comprising an oblique section by the use of a double-sided polishing machine (e.g. a double-sided polishing machine described in the Patent Document 1) and, as a result, have found a problem that edge roll-off occurs in the vicinity of a corner of a back surface (a main surface on the back side) where the substrate mark is formed and further that rising occurs on a surface (a main surface on the side where a thin film having a transfer pattern is to be formed) at a portion corresponding to the vicinity of the corner of the back surface.

The techniques of the Patent Documents 1 to 4 are related to this invention, but suggest nothing about the above-mentioned problem on the substrate mark or about solving this problem.

This invention has been proposed for solving the above-mentioned problem and it is an object of this invention to provide a mask blank substrate, a mask blank, a reflective mask blank, a transfer mask, a reflective mask, and methods of manufacturing them, which, during polishing, can eliminate adverse effects on the flatness due to a substrate mark comprising an oblique section, thereby improving the flatness.

Means for Solving the Problem

In order to accomplish the above-mentioned object, a mask blank substrate according to the present invention is a thin sheet-like substrate and comprises two main surfaces, four side surfaces, an R-surface formed between the adjacent side surfaces, and a chamfered surface formed between the main surface and the side surfaces. The substrate has a substrate mark of an oblique section shape formed across the main surface or the chamfered surface and the R-surface. The substrate mark is such that a distance from a boundary between the substrate mark and the main surface or the chamfered surface to a boundary between the substrate mark and the R-surface is less than 1.5 mm.

Preferably, the substrate mark has an inclination angle of greater than 45° and less than 90° with respect to the main surface.

According to the present invention, a mask blank substrate is a thin sheet-like substrate and comprises two main surfaces, four side surfaces, an R-surface formed between the adjacent side surfaces, and a chamfered surface formed between the main surface and the side surfaces. The substrate has a substrate mark of an oblique section shape formed across the main surface or the chamfered surface and the R-surface. The substrate mark is such that a boundary between the substrate mark and the main surface or the chamfered surface is located on a boundary between the main surface and the chamfered surface or on a peripheral area placed outside of the boundary between the main surface and the chamfered surface and an inclination angle of the substrate mark with respect to the main surface is greater than 45° and less than 90°.

The substrate mark is formed on one side of the main surface opposite to the other side of the main surface on which a thin film having a transfer pattern is to be formed.

According to the present invention, a mask blank comprises, on the main surface of the mask blank substrate mentioned above, a thin film for forming a transfer pattern.

Further, a reflective mask blank according to the present invention comprises, on the main surface of the mask blank substrate mentioned above, a multilayer reflective film and an absorber film serving as a thin film for forming a transfer pattern.

According to the present invention, a transfer mask comprises a transfer pattern formed in the thin film of the mask blank mentioned above.

According to the present invention, a reflective mask comprises a transfer pattern formed in the absorber film of the reflective mask blank mentioned above.

In order to accomplish the above-mentioned object, there is provided a method of manufacturing a mask blank substrate according to the present invention which comprises a substrate mark forming step of, with respect to a thin sheet-like substrate comprising two main surfaces, four side surfaces, an R-surface formed between the adjacent side surfaces, and a chamfered surface formed between the main surface and the side surfaces, forming a substrate mark of an oblique section shape across the main surface or the chamfered surface and the R-surface, and a polishing step of polishing both main surfaces of the substrate using a polishing liquid containing polishing abrasive particles, wherein the substrate mark is formed so that a distance from a boundary between the substrate mark and the main surface or the chamfered surface to a boundary between the substrate mark and the R-surface is less than 1.5 mm.

More preferably, the substrate mark is formed so as to have an inclination angle of greater than 45° and less than 90° with respect to the main surface.

According to the present invention, there is provided a method of manufacturing a mask blank substrate, which comprises a substrate mark forming step of, with respect to a thin sheet-like substrate comprising two main surfaces, four side surfaces, an R-surface formed between the adjacent side surfaces, and a chamfered surface formed between the main surface and the side surfaces, forming a substrate mark of an oblique section shape across the chamfered surface and the R-surface, and a polishing step of polishing both main surfaces of the substrate using a polishing liquid containing polishing abrasive particles, wherein the substrate mark is formed so that a boundary between the substrate mark and the main surface or the chamfered surface is located on a boundary between the main surface and the chamfered surface or on a peripheral area placed outside of the boundary between the main surface and the chamfered surface and an inclination angle of the substrate mark with respect to the main surface is greater than 45° and less than 90°.

The substrate mark is formed on one side of the main surface opposite to the other side of the main surface on which a thin film having a transfer pattern is to be formed.

According to the present invention, a method of manufacturing a mask blank is characterized by comprising providing a thin film for forming a transfer pattern, on the main surface of the mask blank substrate obtained by the method of manufacturing a mask blank substrate mentioned above.

In addition, a method of manufacturing a reflective mask blank according to the present invention is characterized by comprising providing a multilayer reflective film and an absorber film serving as a thin film for forming a transfer pattern, on the main surface of the mask blank substrate obtained by the method of manufacturing a mask blank substrate mentioned above.

Further, a method of manufacturing a transfer mask according to the present invention is characterized by comprising forming a transfer pattern in the thin film of the mask blank obtained by the method of manufacturing a mask blank mentioned above.

Furthermore, a method of manufacturing a reflective mask according to the present invention is characterized by comprising forming a transfer pattern in the absorber film of the mask blank obtained by the method of manufacturing a reflective mask blank mentioned above.

Effect of the Invention

According to a mask blank substrate, a mask blank, a reflective mask blank, a transfer mask, a reflective mask, and methods of manufacturing them of this invention, it is possible, during polishing, to eliminate adverse effects on the flatness due to a substrate mark comprising an oblique section, thereby improving the flatness.

MODE FOR CARRYING OUT THE INVENTION

Figure 8:
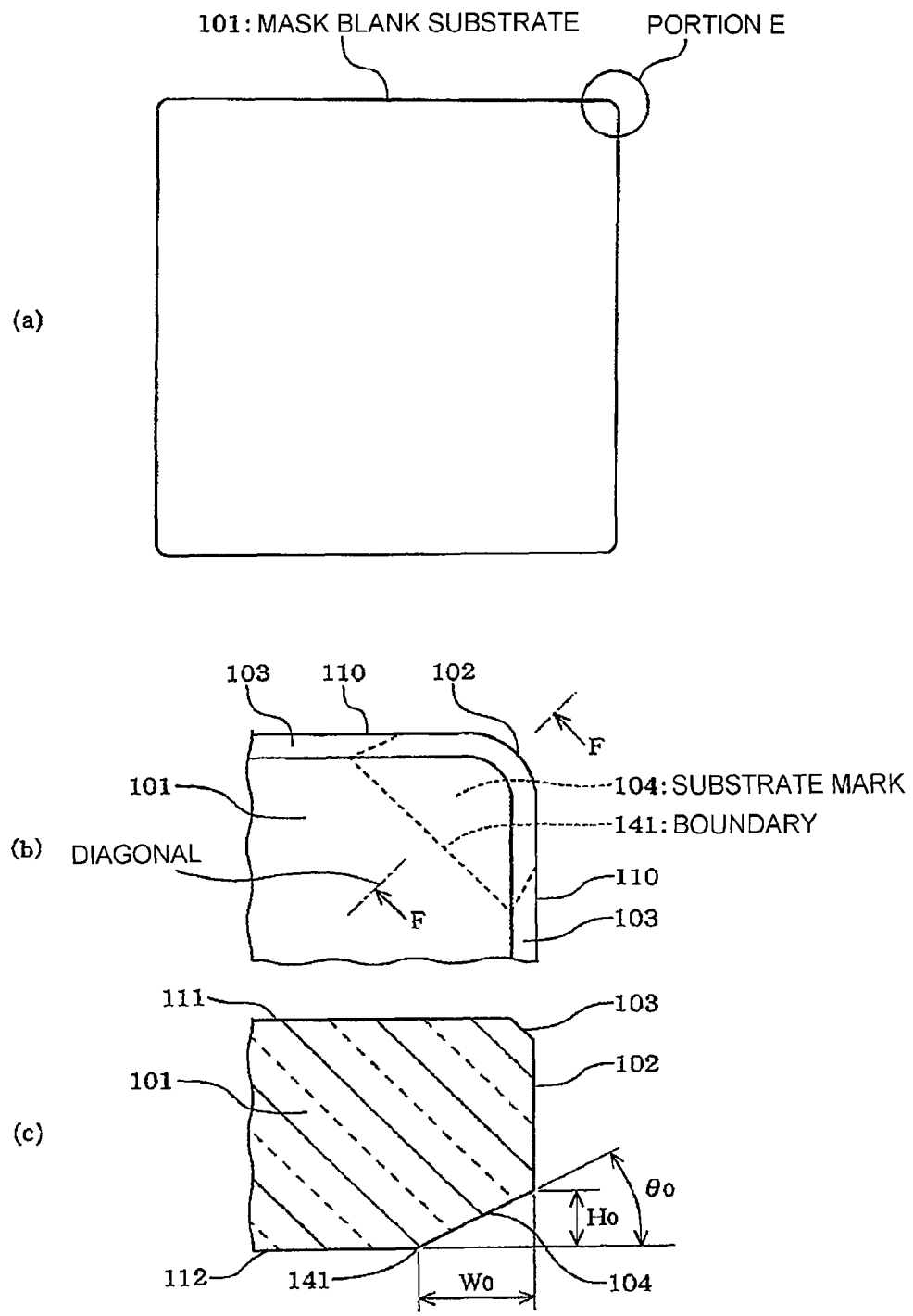
FIG. 8 is a schematic diagram for explaining a substrate mark of a mask blank substrate related to this invention, wherein (a) shows a plan view, (b) shows an enlarged view of a portion E, and (c) shows an F-F cross-sectional view.

A mask blank substrate and a substrate mark related to this invention will be described with reference to the drawings. FIG. 8 is a schematic diagram for explaining a substrate mark of a mask blank substrate related to this invention, wherein (a) shows a plan view, (b) shows an enlarged view of a portion E, and (c) shows an F-F cross-sectional view.

A mask blank substrate 101 shown in FIG. 8 is an example of a mask blank substrate having a rectangular shape in plan view. Herein, the rectangular shape includes not only an oblong shape, but also a square shape. The illustrated mask blank substrate 101 is formed with R-surfaces 102 at corners each formed by two adjacent side surfaces 110 and is further formed with a chamfered surface 103 between each of main surfaces 111 and 112 and the side surfaces 110 (including the R-surfaces 102). Further, a substrate mark 104 is formed at the corner on the back-side main surface 112 (the main surface on the opposite side of the main surface on the side where a thin film for forming a transfer pattern is to be formed) side.

A material of the mask blank substrate 101 is not particularly limited as long as it can be used for a mask blank. For example, use is made of a synthetic quartz glass, a borosilicate glass, an aluminosilicate glass, an aluminoborosilicate glass, a soda-lime glass, or an alkali-free glass, while, particularly as a substrate for use in a reflective mask, use is made of a low thermal expansion glass such as a $SiO_2$—$TiO_2$ glass, or the like.

The mask blank substrate 101 having a length of each side of about 152 mm (6 inches) and a thickness of about 6.35 mm (0.25 inches) is widely used. However, the shape, thickness, and so on of the mask blank substrate 101 are not particularly limited.

The R-surfaces 102 are curved surfaces formed at the four corners of the mask blank substrate 101 and usually have a radius of curvature of 2.5±0.5 mm.

Along the edge of each of the main surfaces 111 and 112, the annular chamfered surface 103 is formed between each of the main surfaces 111 and 112 and the side surfaces 110 (including the R-surfaces 102). This chamfered surface 103 is an inclined surface (also called a C-surface) inclined at about 45° and usually has a chamfer width of 0.4 to 0.6 mm.

The mask blank substrate 101 is formed with the substrate mark 104 on the back-side main surface 112, but not limited to this.

The substrate mark 104 is formed at the upper-right corner in FIG. 8 and has the shape of an oblique section (single oblique section) formed across the main surface 112, the R-surface 102, the side surfaces 110 continuous with the R-surface 102, and the chamfered surface 103 between the main surface 112 and the side surfaces 110 (including the R-surface 102).

The substrate mark 104 has a linear boundary 141 crossing the main surface 112 (i.e. the boundary 141 between the substrate mark 104 and the main surface 112) and a linear boundary crossing the R-surface 102 (i.e. the boundary between the substrate mark 104 and the R-surface 102). The distance $W_0$ from the boundary 141 between the substrate mark 104 and the main surface 112 to the boundary between the substrate mark 104 and the R-surface 102 (this distance $W_0$ is a distance on a virtual plane including the vicinity of the central portion of the main surface 112 and is the maximum value of the distances from arbitrary points of the boundary 141 to the boundary between the substrate mark 104 and the R-surface 102 in a direction perpendicular to the line of the boundary 141) is set to about 2.4 mm in this example. The maximum value $H_0$ of the heights from the virtual plane including the vicinity of the central portion of the main surface 112 to the boundary between the substrate mark 104 and the R-surface 102 in a side surface direction is set to about 1 mm in this example. The inclination angle $\theta_0$ of the substrate mark 104 with respect to the main surface 112 is about 25°.

The mask blank substrate 101 of FIG. 8 is formed with the substrate mark 104 at its one corner. However, substrate marks 104 may be respectively formed at a plurality of corners according to a material or the like, thereby judging the material based on the number, positions, or the like of these formed substrate marks 104. Usually, the substrate mark 104 is formed by grinding using a diamond whetstone or the like and further is mirror-finished in order to prevent adhesion of dirt in a cleaning process or the like.

Figure 9:
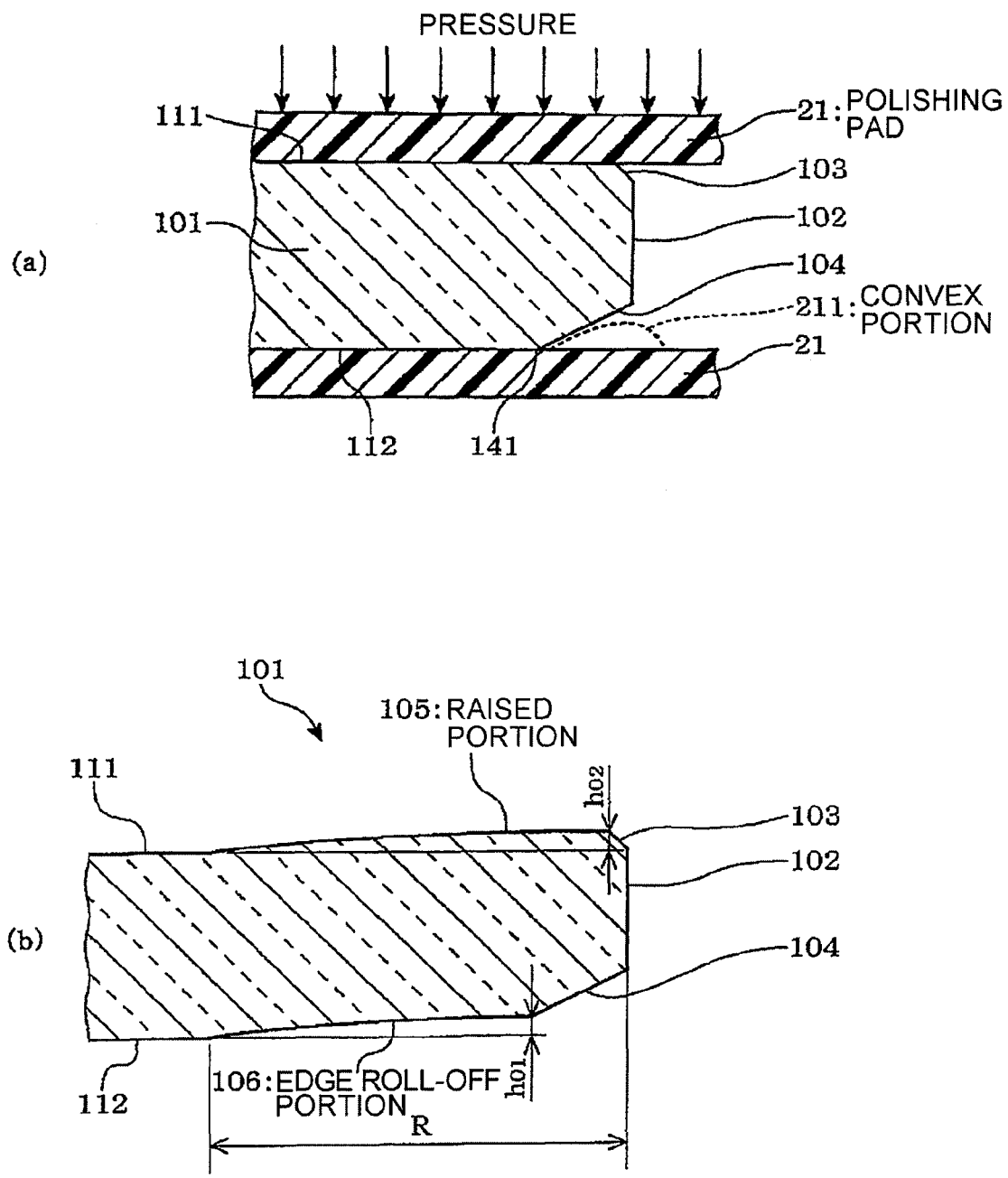
FIG. 9 is a schematic diagram of a main portion of a mask blank substrate for explaining the subject of this invention, wherein (a) shows an enlarged cross-sectional view upon starting an ultra-precision polishing process and (b) shows an enlarged cross-sectional view after finishing the ultra-precision polishing process.

Herein, a problem of edge roll-off and rising in the general mask blank substrate 101 will be described with reference to the drawings. FIG. 9 is a schematic diagram of a main portion of the mask blank substrate, wherein (a) shows an enlarged cross-sectional view upon starting an ultra-precision polishing process on the main surfaces 111 and 112 and (b) shows an enlarged cross-sectional view after finishing the ultra-precision polishing process.

In FIG. 9(a), the mask blank substrate 101 is sandwiched between a pair of facing polishing pads 21 provided in a double-sided polishing machine. A polishing liquid containing colloidal silica (not illustrated) is supplied to the polishing pads 21 and a predetermined pressure is applied thereto in a vertical direction. Usually, an ultra-soft polisher (suede type) is used as the polishing pad 21.

The mask blank substrate 101 sandwiched between the polishing pads 21, being in a state where it is held by a carrier (not illustrated), makes an orbital motion while rotating on its axis so that the polishing process is carried out on the main surfaces 111 and 112 simultaneously.

In this event, since the main surface 112 presses the lower polishing pad 21, a convex portion 211 indicated by a broken line and made of the lower polishing pad 21 is formed under the substrate mark 104, i.e. in a region, located outside the boundary 141 and not pressed by the substrate 101, of the lower polishing pad 21. Further, it is conjectured that since the mask blank substrate 101 orbits and rotates on its axis in the above-mentioned state, the mask blank substrate 101 is polished in a state where the stress-concentrated boundary 141 is brought into contact with and rides over the convex portion 211. Therefore, the main surface 112 in the vicinity of the boundary 141 falls into a state of being excessively polished compared to the other region of the main surface 112.

In the mask blank substrate 101 polished for a predetermined time, as shown in FIG. 9(b), an edge roll-off portion 106 is largely formed on the main surface 112 in the vicinity of the R-surface 102 formed with the substrate mark 104. On the other hand, conversely, a raised portion 105 is formed on the main surface 111 at a portion corresponding to the vicinity of the R-surface 102 (the main surface 111 in a region corresponding to the region, where the edge roll-off portion 106 is formed, of the main surface 112).

The edge roll-off portion 106 has a depression amount $h_{01}$ of 0.1 μm or more with respect to the virtual plane including the vicinity of the central portion of the main surface 112 while the raised portion 105 has a protrusion amount $h_{02}$ of 0.1 μm or more with respect to a virtual plane including the vicinity of the central portion of the main surface 111. Further, the edge roll-off portion 106 and the raised portion 105 are each formed generally in a region within a radius R (R=about 5 to 15 mm) from the R-surface 102.

Herein, the regions where the edge roll-off portion 106 and the raised portion 105 are formed approximately correspond to each other and $h_{01} \approx h_{02}$. This is conjectured to be caused by a phenomenon that when the edge roll-off portion 106 starts to be formed on the main surface 112 side, a gap is formed between the edge roll-off portion 106 and the lower polishing pad 21 to cause a reduction in pressure on the lower side so that the pressure on the main surface 111 side applied from the upper polishing pad 21 tends to escape to the lower side, resulting in a reduction in polishing rate on the upper side.

[First Embodiment of Mask Blank Substrate and its Manufacturing Method]

Figure 1:
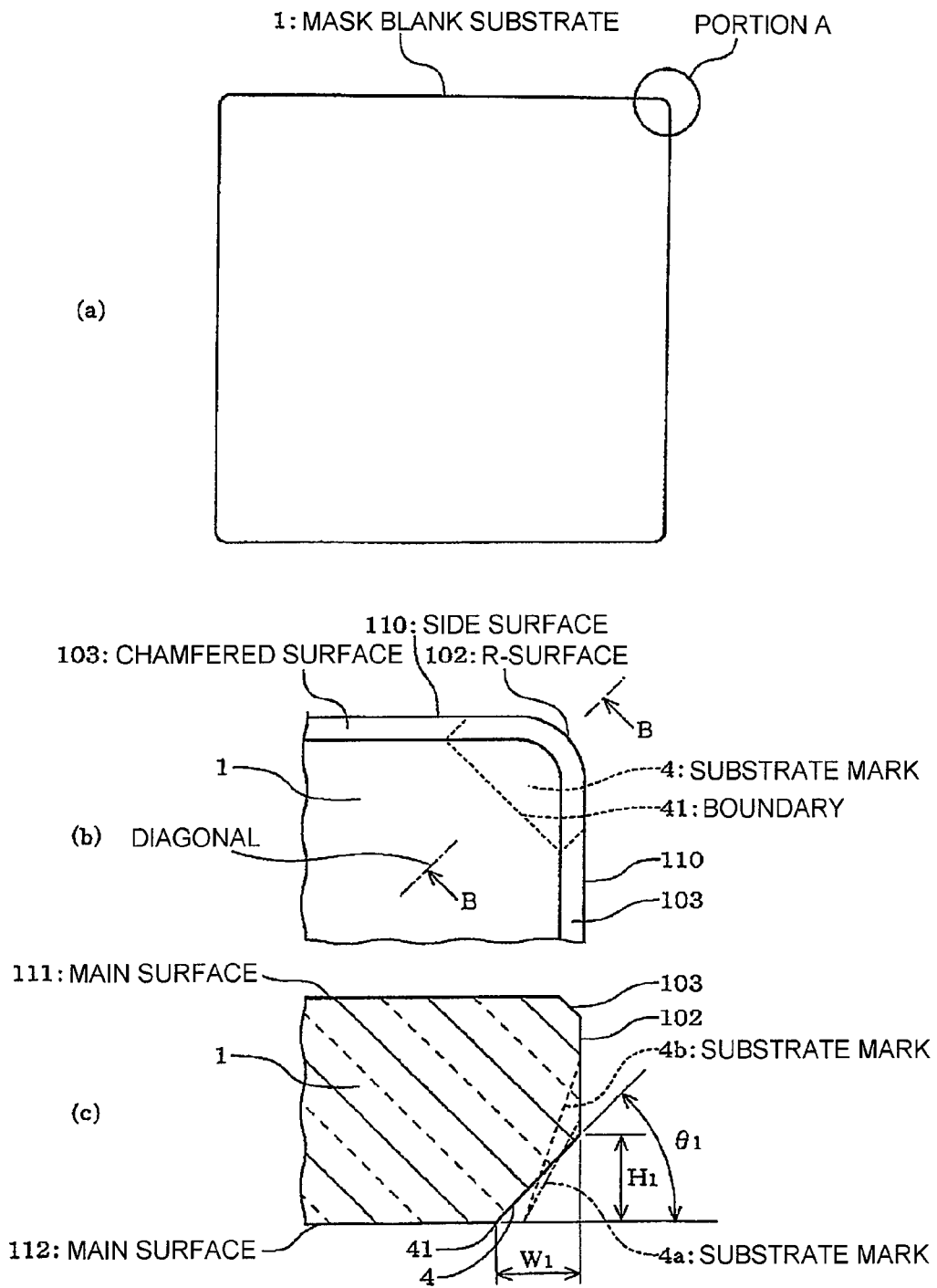
FIG. 1 is a schematic diagram for explaining a substrate mark of a mask blank substrate according to a first embodiment of this invention, wherein (a) shows a plan view, (b) shows an enlarged view of a portion A, and (c) shows a B-B cross-sectional view.

FIG. 1 is a schematic diagram for explaining a substrate mark of a mask blank substrate according to a first embodiment of this invention, wherein (a) shows a plan view, (b) shows an enlarged view of a portion A, and (c) shows a B-B cross-sectional view.

In FIG. 1, a mask blank substrate 1 of this embodiment has a structure in which a substrate mark 4 comprising an oblique section is formed.

Compared to the above-mentioned mask blank substrate 101, the mask blank substrate 1 differs in that, instead of the substrate mark 104, the substrate mark 4 having a different cross-sectional shape and size is formed. The other structure of this embodiment is substantially the same as that of the mask blank substrate 101.

Therefore, in FIG. 1, the same symbols are assigned to the same constituent portions as those in FIG. 8, thereby omitting a detailed description thereof.

(Substrate Mark)

The substrate mark 4 is formed at an upper-right corner also in FIG. 1 like the substrate mark 104 and has the shape of an oblique section (single oblique section) formed across a main surface 112, an R-surface 102, two side surfaces 110 continuous with the R-surface 102, and a chamfered surface 103 between the main surface 112 and the side surfaces 110 (including the R-surface 102).

The substrate mark 4 has a linear boundary 41 crossing the main surface 112 (i.e. the boundary 41 between the substrate mark 4 and the main surface 112) and a linear boundary crossing the R-surface 102 (i.e. the boundary between the substrate mark 4 and the R-surface 102). The distance $W_1$ from the boundary 41 between the substrate mark 4 and the main surface 112 to the boundary between the substrate mark 4 and the R-surface 102 (this distance $W_1$ is a distance on a virtual plane including the vicinity of the central portion of the main surface 112 and is the maximum value of the distances from arbitrary points of the boundary 41 to the boundary between the substrate mark 4 and the R-surface 102 in a direction perpendicular to the line of the boundary 41) is less than 1.5 mm. This distance $W_1$ is preferably 1.4 mm or less.

The maximum value $H_1$ of the heights from the virtual plane including the vicinity of the central portion of the main surface 112 to the boundary between the substrate mark 4 and the R-surface 102 in a side surface direction is not particularly limited. Taking into account to facilitate visual recognition of the substrate mark 4, $H_1$ is preferably set to 1.2 mm or more and more preferably 1.5 mm or more. In other words, in the case of a mask blank substrate with a thickness of 6.35 mm, the maximum height $H_1$ of the substrate mark 4 preferably exceeds 18% of the thickness and is more preferably 24% or more of the thickness.

The surface shape of the substrate mark 4 is preferably a shape with high symmetry with respect to a diagonal B passing through the R-surface 102 of the substrate (axially symmetrical shape). If the symmetry of the surface shape of the substrate mark 4 is high, the symmetry of the surface shapes of the main surfaces 111 and 112 after being polished in a polishing process tends to be high.

In the case of the mask blank substrate, the main surfaces 111 and 112 are each required to have a high-level surface roughness. Therefore, the polishing process should be carried out on the main surfaces of the substrate after a grinding process. As described before, when the polishing process is carried out on the main surfaces, edge roll-off proceeds from the boundary 41 toward the center side of the main surface so that the edge roll-off portion 106 is formed after the polishing process (see FIG. 9(b)). If the above-mentioned distance $W_1$ is set to 1.5 mm or more, the edge roll-off portion 106 which is formed after the polishing process excessively proceeds toward the center side of the main surface 112. Further, since the raised portion 105 is formed on the main surface 111 corresponding to the edge roll-off portion 106, adverse effects on the flatness of the main surface 111 become large. If the above-mentioned distance $W_1$ is set to less than 1.5 mm, it is possible to minimize the proceeding of the edge roll-off portion 106 toward the center side of the main surface 112 and further to minimize the proceeding of the raised portion 105 toward the center side of the main surface 111 and, therefore, it is possible to improve the flatness of the main surface 111 after the polishing process to a predetermined value or less.

The mask blank substrate of this invention is applicable to any of a light-transmissive transfer mask for use in the light-transmission lithography and a mask blank serving as a base therefor, and a reflective mask for use in the reflection lithography and a reflective mask blank serving as a base therefor. In particular, in the substrate for use in the reflective mask, the flatness and surface roughness of the main surface are both required to be at very high levels. For example, the flatness should be 0.05 µm or less in a 132 mm×132 mm square region with respect to the center of the main surface (a region, on the main surface 111, located more on the center side than positions, inclusive, which are displaced inward by 10 mm from positions of the side surfaces 110). The surface roughness of the main surface should be 0.15 nm or less by root mean square roughness Rq in a 10 µm×10 µm square region.

Usually, substrates after a polishing process often cannot satisfy the required high flatness described above. Therefore, conventionally, the main surface shape of the substrate after the polishing process is measured and convex portions of its main surface are locally processed, thereby manufacturing the substrate satisfying the above-mentioned flatness. However, as the region of the convex portions on the main surface becomes larger or the height of the convex portions on the main surface becomes higher, the processing time for the local processing is prolonged. Further, usually, as the time for carrying out the local processing is prolonged, the degree of degradation of the surface roughness of the main surface well finished in the polishing increases. Taking these into account, it is important to define the shape of a substrate mark so that the flatness of the substrate after the polishing process can satisfy the above-mentioned numerical value or that even if unable to satisfy the value, the flatness becomes as close to the value as possible.

Usually, in the reflective mask, a conductive film made of a conductive material is provided on the main surface 112 on the opposite side of the main surface 111 on which a multi-layer reflective film is formed. Then, when setting the reflective mask in an exposure apparatus, the reflective mask is fixed by electrostatically chucking the entire surface of the conductive film on a planar chuck stage. Therefore, the main surface 112 is also required to have good flatness of the above-mentioned predetermined value or less and thus it is important to define the shape of a substrate mark that can suppress the proceeding of an edge roll-off portion of the main surface 112 toward its center side.

On the other hand, also in the case of the light-transmissive transfer mask, the main surface 111 on the side where a pattern-forming thin film is provided is required to have good flatness and thus it is important to define the shape of the substrate mark 4 as described above.

The inclination angle $\theta_1$ of the substrate mark 4 with respect to the main surface 112 is preferably set to greater than 45° and less than 90°. More preferably, the inclination angle $\theta_1$ is set to 60° or more and less than 90°. With this configuration, the substrate mark 4 can have a surface extending in a thickness direction so that it is possible to improve the visuality.

Further, more preferably, the above-mentioned distance $W_1$ is set to less than 1.0 mm. With this configuration, it is possible to minimize the proceeding of the edge roll-off portion 106 toward the center side of the main surface 112 and further to minimize the proceeding of the raised portion 105 toward the center side of the main surface 111 and, therefore, even if the range where the flatness of each of the main surfaces 111 and 112 can be improved to the above-mentioned predetermined value or less is increased (e.g. a 142 mm×142 mm square region or the like with respect to the center of the main surface), it is possible to reduce the time required for local processing.

Further, it is preferable that the boundary 41 of the substrate mark 4 be substantially perpendicular to the diagonal B passing through the R-surface 102 of the substrate. With this configuration, distribution of the edge roll-off portion 106 of the main surface 112 after the polishing process can have a tendency to have high axial symmetry with respect to the diagonal B.

In a substrate mark 4a indicated by a two-dot chain line in FIG. 1(c), the distance $W_1$ is set to about 0.9 mm and the inclination angle $\theta_1$ is set to about 60°. Further, in a substrate mark 4b indicated by a broken line in FIG. 1(c), the distance $W_1$ is set to about 0.9 mm and the inclination angle $\theta_1$ is set to about 70°. As described above, the mask blank substrate 1 formed with the substrate mark 4a or the substrate mark 4b can further improve the flatness.

The dimensions of the substrate mark 4 and so on are not limited to those described above. As long as the condition of the distance $W_1$ being less than 1.5 mm is satisfied, the dimensions are set properly.

By setting the distance $W_1$ of the substrate mark 4 so as to satisfy the condition shown in the first embodiment, it is possible to minimize the proceeding of the raised portion 105 and the edge roll-off portion 106, which are caused by the substrate mark 4. Specifically, on the main surface 111 of the substrate, at positions shifted by 10 mm from positions of the side surfaces 110, as seen from the main surface 111, toward the center of the main surface 111 (hereinafter referred to as a center region), it is possible to minimize the proceeding of the raised portion 105 and the edge roll-off portion 106 toward the center region, regardless of the length of each side of the substrate formed with the substrate mark 4 (a substrate having a rectangular main surface with each side having a length greater than 6 inches, for example, a length of 8 inches or more, a substrate having a rectangular main surface with each side having a length less than 6 inches, for example, a length of 5 inches or less, or the like). As a result, it is possible to significantly improve the flatness of the center region of each of the main surfaces 111 and 112 after the polishing process.

Next, a method of manufacturing the mask blank substrate 1 will be described.

The mask blank substrate manufacturing method of this embodiment is a method comprising a substrate mark forming process of forming the substrate mark 4 comprising the oblique section on the mask blank substrate 1 and a polishing process of polishing both surfaces of the mask blank substrate 1 using a polishing liquid containing polishing abrasive particles.

(Substrate Mark Forming Process)

First, in the substrate mark forming process, the substrate mark 4 is formed to the mask blank substrate 1 so that the distance $W_1$ becomes less than 1.5 mm (see FIG. 1).

Usually, the substrate mark 4 is formed by grinding using a diamond whetstone or the like and further is mirror-finished in order to prevent adhesion of dirt in a cleaning process or the like.

(Polishing Process)

Then, in the polishing process, using a double-sided polishing machine (e.g. a double-sided polishing machine described in the Patent Document 1), polishing is carried out with respect to the mask blank substrate 1 formed with the substrate mark 4.

Usually, the polishing comprises rough polishing and precision polishing each using a polishing liquid containing cerium oxide and ultra-precision polishing using a polishing liquid containing colloidal silica, thereby carrying out the polishing stepwise.

Although not illustrated, the double-sided polishing machine is of the planetary gear type and comprises a sun gear, an internal gear concentrically disposed around the sun gear, a carrier meshed with the sun gear and the internal gear and adapted to make an orbital motion while rotating on its axis according to the rotation of the sun gear and the internal gear, upper and lower surface plates respectively bonded with polishing pads and adapted to hold therebetween the mask blank substrate 1 held by the carrier, a polishing liquid supply portion which supplies a polishing liquid between the upper and lower surface plates, and so on.

In the double-sided polishing machine, the mask blank substrate 1 held by the carrier is sandwiched between the upper and lower surface plates and the carrier makes an orbital motion while rotating on its axis according to the rotation of the sun gear and the internal gear while the polishing liquid is supplied between the polishing pads of the upper and lower surface plates and the mask blank substrate 1, so that both main surfaces 111 and 112 of the mask blank substrate 1 are polished simultaneously.

Since the substrate mark 4 is formed under the above-mentioned conditions, as described above, the mask blank substrate 1 subjected to the polishing (particularly the ultra-precision polishing) can effectively eliminate the adverse effects such as the formation of the raised portion 105 and the edge roll-off portion 106 (see FIG. 9) and thus can achieve high flatness.

Depending on a method of manufacturing the mask blank substrate 1, as described in the Patent Document 2, a concave-convex shape measurement process and a flatness control process may be carried out after the polishing process of this embodiment (this process corresponds to the preparation process in the Patent Document 2). Even in this case, the polishing process of this embodiment which can achieve high flatness is effective and is capable of reducing the workload in the flatness control process (the load of carrying out local polishing) and thus improving the productivity and so on.

In this embodiment, the polishing is carried out using the double-sided polishing machine of the planetary gear type. However, the polishing machine is not limited thereto. For example, use may be made of a double-sided polishing machine of another type or a single-side polishing machine adapted to carry out polishing on one side at a time.

As described above, according to the mask blank substrate 1 and its manufacturing method of this embodiment, it is possible, in the polishing, to eliminate the adverse effects on the flatness due to the substrate mark 4 comprising the oblique section, thereby improving the flatness of the mask blank substrate 1.

[Second Embodiment of Mask Blank Substrate and its Manufacturing Method]

Figure 2:
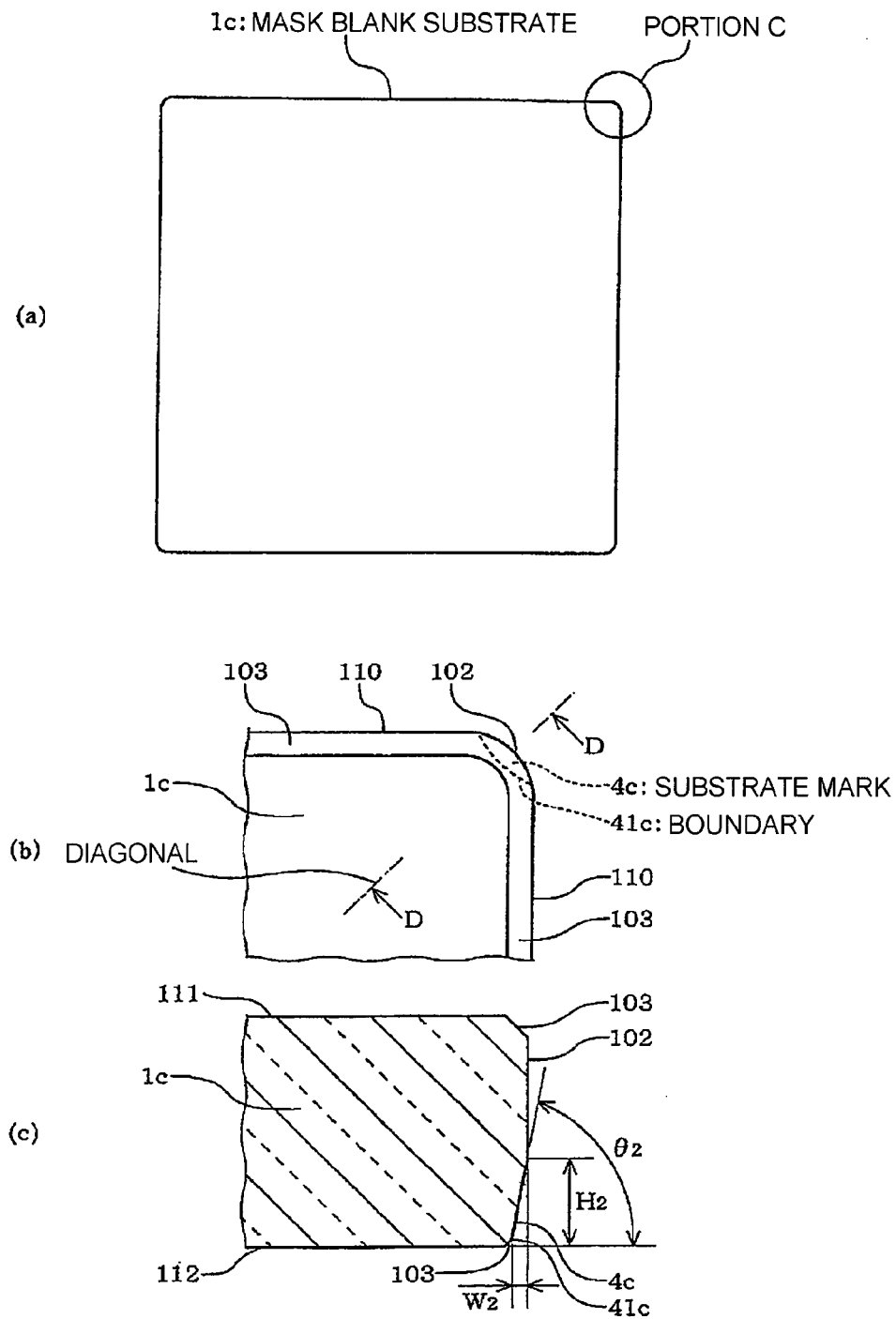
FIG. 2 is a schematic diagram for explaining a substrate mark of a mask blank substrate according to a second embodiment of this invention, wherein (a) shows a plan view, (b) shows an enlarged view of a portion C, and (c) shows a D-D cross-sectional view.

FIG. 2 is a schematic diagram for explaining a substrate mark of a mask blank substrate according to a second embodiment of this invention, wherein (a) shows a plan view, (b) shows an enlarged view of a portion C, and (c) shows a D-D cross-sectional view.

Compared to the above-mentioned mask blank substrate 1, a mask blank substrate 1c of this embodiment in FIG. 2 differs in that a substrate mark 4c is formed instead of the substrate mark 4, and so on. The other structure of this embodiment is substantially the same as that of the mask blank substrate 1.

Therefore, in FIG. 2, the same symbols are assigned to the same constituent portions as those in FIG. 1, thereby omitting a detailed description thereof.

(Substrate Mark)

The substrate mark 4c is formed at an upper-right corner also in FIG. 2 like the substrate mark 4 and has the shape of an oblique section (single oblique section) formed across a chamfered surface 103 between a main surface 112 and side surfaces 110 (including an R-surface 102) and the R-surface 102.

The substrate mark 4c has a curved boundary 41c crossing the chamfered surface 103 (i.e. the boundary 41c between the substrate mark 4c and the chamfered surface 103) and a line boundary crossing the R-surface 102 (i.e. the boundary between the substrate mark 4c and the R-surface 102). The boundary 41c is located in the outer peripheral side than the boundary between the main surface 112 and the chamfered surface 103.

Herein, as one example, the distance $W_2$ from the boundary 41c between the substrate mark 4c and the chamfered surface 103 to the boundary between the substrate mark 4c and the R-surface 102 (this distance $W_2$ is a distance on a virtual plane including the vicinity of the central portion of the main surface 112 and is the maximum value of the distances from arbitrary points of the boundary 41c to the boundary between the substrate mark 4c and the R-surface 102 in a direction perpendicular to the line (tangent) of the boundary 41c) is set to about 0.3 mm. Further, the maximum value $H_2$ of the heights from the virtual plane including the vicinity of the central portion of the main surface 112 to the boundary between the substrate mark 4c and the R-surface 102 in a side surface direction is set to about 1.1 mm and the inclination angle $\theta_2$ of the substrate mark 4c with respect to the main surface 112 is about 75°. Therefore, the substrate mark 4c satisfies a condition that the inclination angle $\theta_2$ is greater than 45° and less than 90°. That is, the maximum value $H_2$ of the substrate mark 4c according to this embodiment is 17% or more of the thickness (6.35 mm).

Since the substrate mark 4c is formed so as to be located on the boundary between the main surface 112 and the chamfered surface 103 or on a peripheral area placed outside of the boundary between the main surface 112 and the chamfered surface 103, it is possible to substantially eliminate the difference between this corner and the other corners formed without any substrate mark 4c with respect to the proceeding of the edge roll-off portion 106 toward the center side of the main surface 112 due to the formation of the substrate mark 4c in the polishing process. Further, since it is possible to eliminate the difference between the respective corners with respect to the edge roll-off portion 106 of the main surface 112, it is also possible to substantially eliminate the difference between the respective corners with respect to the raised portion 105 formed on the main surface 111 on the opposite side. Further, with this effect, the flatness of each of the main surfaces 111 and 112 after the polishing process can be improved to the predetermined value or less. Since there is substantially no difference between the respective corners with respect to the raised portion 105 of the main surface 111 and there is substantially no difference between the respective corners with respect to the edge roll-off portion 106 of the main surface 112, each of the main surfaces 111 and 112 can have a surface shape with high axial symmetry and high point symmetry.

The substrate mark 4c has the above-mentioned effect. Therefore, by satisfying the conditions shown in this second embodiment, the flatness can be improved. Specifically, on the main surface 111 of the substrate, at positions shifted by 10 mm from positions of the side surfaces 110, as seen from the main surface 111, toward the center of the main surface 111 (hereinafter referred to as a center region), the flatness can be improved to the predetermined value or less, regardless of the length of each side of the substrate formed with the substrate mark 4c (a substrate having a rectangular main surface with each side having a length greater than 6 inches, for example, a length of 8 inches or more, a substrate having a rectangular main surface with each side having a length less than 6 inches, for example, a length of 5 inches or less, or the like). The flatness can also be improved to the predetermined value or more on the main surface 112 on the opposite side. Further, each of the main surfaces 111 and 112 can have a surface shape with high axial symmetry and high point symmetry.

Even if local processing is carried out with respect to convex portions of the main surfaces 111 and 112 in order to satisfy the predetermined value of the flatness required for the mask blank substrate particularly for use in a reflective mask, the processing time can be significantly shortened. Further, it is also possible to suppress degradation of the surface roughness of the main surfaces 111 and 112 due to the local processing.

Further, by setting the inclination angle $\theta_2$ of the substrate mark 4 with respect to the main surface 112 to greater than 45° and less than 90°, the substrate mark 4c can have a surface extending in a thickness direction so that it is possible to improve the visuality. More preferably, the inclination angle $\theta_2$ is set to 60° or more and less than 90°.

Compared to the manufacturing method of the above-mentioned embodiment, a method of manufacturing the mask blank substrate 1c differs in that, instead of the substrate mark 4, the substrate mark 4c having the different inclination angle is formed, and so on. Except this difference, the manufacturing method of this embodiment is substantially the same as the manufacturing method of the above-mentioned embodiment. This method can further improve the flatness of the mask blank substrate 1c.

As described above, according to the mask blank substrate 1c and its manufacturing method of this embodiment, it is possible to exhibit substantially the same effect as that of the above-mentioned embodiment and, further, it is possible to almost completely eliminate the adverse effects on the flatness due to the substrate mark 4c, thereby achieving further excellent high flatness of the mask blank substrate 1c.

[Embodiment of Mask Blank and its Manufacturing Method]

A mask blank of this embodiment has a structure in which a thin film for forming a transfer pattern is provided on the main surface 111 of each of the mask blank substrates 1 and 1c of the above-mentioned first and second embodiments. Using the mask blank substrate 1, 1c, this mask blank can achieve excellent high flatness.

The thin film formed in the light-transmissive mask blank is a thin film adapted to cause an optical change on exposure light (light emitted from an exposure light source) which is used when carrying out transfer to a transfer target. For example, a light-shielding film, a halftone phase shift film, a light-semitransmissive film, or the like can be cited. The light-shielding film has an optical density of a predetermined value or more (e.g. optical density of 3.0 or more, 2.5 or more, or the like) for exposure light and has a function of shielding the exposure light. The mask blank using the light-shielding film as the thin film for forming the transfer pattern is mainly used for manufacturing a binary transfer mask or a dug-down- or an engraved-type Levenson mask. The light-shielding film is not limited to a single-layer structure and may have a structure in which a light-shielding layer mainly with a light-shielding function and an antireflection layer mainly with a function of reducing the reflectance for exposure light are laminated. As a material applicable to the light-shielding film, there is a material containing Cr, a material containing a transition metal and silicon, a material containing Ta, or the like.

As the material containing Cr, there can be cited, specifically, a Cr metal or a Cr compound containing Cr and one or more elements selected from N, C, O, F, and H. As the material containing the transition metal and silicon, there can be cited a transition metal silicide composed of a transition metal and silicon, or a transition metal silicide compound containing a transition metal silicide and one or more elements selected from C, N, O, and B. The transition metal is preferably a metal selected from Mo, Ta, Hf, Zr, Cr, Ti, V, Ni, Fe, Nb, W, Ru, Rh, Pd, and Ag or an alloy thereof. As the material containing Ta, there can be cited a Ta metal or a Ta compound containing Ta and one or more elements selected from B, C, N, and O.

The halftone phase shift film is a film adapted to transmit exposure light at a predetermined transmittance and to provide a predetermined phase difference thereto with respect to exposure light transmitted through a light-transmissive portion not formed with this film and has a function of producing a phase shift effect between the exposure light transmitted through this film and the exposure light transmitted through the light-transmissive portion. The mask blank using the halftone phase shift film as the thin film for forming the transfer pattern is mainly used for manufacturing a halftone phase shift mask. As a material applicable to the halftone phase shift film, there is a material containing a transition metal and silicon, or the like. As the material containing the transition metal and silicon, there can be cited a transition metal silicide compound containing a transition metal silicide composed of a transition metal and silicon and one or more elements selected from C, N, O, and B. The transition metal is the same as that in the case of the light-shielding film.

The light-semitransmissive film is a film adapted to transmit exposure light at a predetermined transmittance and adapted to produce a phase difference that does not substantially produce a phase shift effect between exposure light transmitted through this film and exposure light transmitted through a light-transmissive portion, or not adapted to produce a phase difference. The mask blank using the light-semitransmissive film as the thin film for forming the transfer pattern is mainly used for manufacturing an enhancer phase shift mask. As a material applicable to the light-semitransmissive film, a material containing a transition metal and silicon is preferable as in the case of the halftone phase shift film.

For the light-transmissive mask blank, g-line (wavelength: 436 nm), i-line (wavelength: 365 nm), KrF (wavelength: 246 nm), ArF (wavelength: 193 nm), or F2 (wavelength: 157 nm) is used as an exposure light source.

The above-mentioned light-shielding film, halftone phase shift film, and light-semitransmissive film can be formed by, for example, sputtering such as DC sputtering, RF sputtering, or ion-beam sputtering.

Next, a mask blank manufacturing method of this embodiment is a method of forming each of the above-listed transfer-pattern thin films on each of the mask blank substrates 1 and 1c obtained by the mask blank substrate manufacturing methods of the above-mentioned first and second embodiments.

According to this mask blank manufacturing method, it is possible to achieve excellent high flatness using the mask blank substrate 1, 1c.

As described above, according to the mask blank and its manufacturing method of this embodiment, it is possible to provide the mask blank having excellent high flatness.

[Embodiment of Reflective Mask Blank and its Manufacturing Method]

A reflective mask blank of this embodiment has a structure in which at least a multilayer reflective film adapted to reflect exposure light with high reflectance and an absorber film, on the multilayer reflective film, having a function of absorbing the exposure light and serving as a thin film for forming a transfer pattern are provided on the main surface 111 of each of the mask blank substrates 1 and 1c of the above-mentioned first and second embodiments. The reflective mask blank of this embodiment may have a structure in which a protective film or a buffer film is provided between the multilayer reflective film and the absorber film. The reflective mask blank of this embodiment may also have a structure in which a conductive film having conductivity is provided on the main surface 112 on the opposite side of the main surface 111 formed with the multilayer reflective film and so on.

The multilayer reflective film has a film structure in which, given that stacking of a low refractive index layer made of a material with a low refractive index for exposure light and a high refractive index layer made of a material with a high refractive index for the exposure light forms one cycle, low refractive index layers and high refractive index layers are laminated by a plurality of cycles (at least 20 cycles or more, preferably 40 cycles or more). When EUV (Extreme Ultra Violet) light with a wavelength of about 13.5 nm is used as the exposure light, the low refractive index layer is preferably a Si layer while the high refractive index layer is preferably a Mo layer.

The absorber film is a thin film for forming a transfer pattern and is required to have high absorption performance for exposure light. When the exposure light is EUV light, the absorber film is preferably formed of a material containing Ta. Specifically, there can be cited a Ta metal, a Ta compound composed of Ta and one or more elements selected from B, Hf, Zr, Nb, Pt, W, Au, Re, Os, and Si, a material containing a Ta metal or a Ta compound and one or more elements selected from N, O, and C, or the like.

The protective film mainly serves to protect the multilayer reflective film during dry etching for forming a transfer pattern in the absorber film and to protect the multilayer reflective film in a cleaning process which is carried out in the manufacture of a reflective mask and for the manufactured reflective mask. As a material applicable to the protective film, there can be cited a material containing Ru, a material containing Si, or the like. The material containing Ru is preferably a Ru metal, an alloy of Ru and one or more metals selected from Nb, Zr, Mo, Ti, and La, or the like.

The buffer film is made of a material having resistance to an etching gas which is used for dry-etching the absorber film. After the transfer pattern is formed in the absorber film, the buffer film is patterned by dry etching using the absorber pattern as a mask. The material forming the buffer film is required, in addition to having resistance to the etching gas which is used for dry-etching the absorber film, such that an etching gas for dry-etching the buffer film itself does not damage the multilayer reflective film. When the absorber film is a Ta-based material, the buffer film is preferably a material containing Cr. Specifically, there can be cited a Cr metal or a Cr compound containing Cr and one or more elements selected from N, C, O, F, and H.

The conductive film is a film which is required when electrostatically chucking the substrate on a rotary stage for forming the multilayer reflective film and when electrostatically chucking a manufactured reflective mask on a mask stage of an exposure apparatus and, in terms of its role, the conductivity is required. As a material suitable for this conductive film, there can be cited a material containing Cr or a material containing Ta. Specifically, as the material containing Cr, there is a Cr metal or a Cr compound containing Cr and one or more elements selected from N, C, O, F, and H. As the material containing Ta, there is a Ta metal or a Ta compound containing Ta and one or more elements selected from B, C, N, and O.

The above-mentioned multilayer reflective film, absorber film, protective film, buffer film, and conductive film can be formed by, for example, sputtering such as DC sputtering, RF sputtering, or ion-beam sputtering.

In the case of the reflective mask blank, since this is for manufacturing a reflective mask for use in the reflection lithography, the mask blank substrate is not required to have high transmittance for exposure light. Instead, since the influence of heat generated from the multilayer reflective film during exposure is large, the substrate is required to be formed of a material with a low thermal expansion coefficient. As the substrate made of the low thermal expansion coefficient material, there can be cited a $SiO_2$—$TiO_2$-based glass, an amorphous glass such as a quartz glass, a crystallized glass precipitated with β-quartz solid solution, or the like.

Next, a reflective mask blank manufacturing method of this embodiment is a method of forming, on each of the mask blank substrates 1 and 1c obtained by the mask blank substrate manufacturing methods of the above-mentioned first and second embodiments, at least a multilayer reflective film adapted to reflect exposure light with high reflectance and an absorber film, on the multilayer reflective film, having a function of absorbing the exposure light and serving as a thin film for forming a transfer pattern. According to this reflective mask blank manufacturing method, it is possible to achieve excellent high flatness using the mask blank substrate 1, 1c.

As described above, according to the reflective mask blank and its manufacturing method of this embodiment, it is possible to provide the mask blank having excellent high flatness.

[Embodiment of Transfer Mask and its Manufacturing Method]

A transfer mask of this embodiment has a structure in which a transfer pattern is formed in the thin film of the above-mentioned mask blank. Using the above-mentioned mask blank, this transfer mask can achieve excellent and good flatness.

Next, a transfer mask manufacturing method of this embodiment is a method of forming a transfer pattern in the thin film of the mask blank obtained by the mask blank manufacturing method of the above-mentioned embodiment.

Specifically, the transfer mask manufacturing method usually comprises a process of preparing the mask blank obtained by the above-mentioned mask blank manufacturing method, a pattern forming process of forming a resist film on the thin film by spin coating or the like and exposing/writing a transfer pattern on the resist film, thereby forming a desired resist pattern through development and so on, and a thin film pattern forming process of removing the thin film by etching using the resist pattern as a mask, thereby forming a transfer pattern in the thin film.

According to this transfer mask manufacturing method, it is possible to achieve excellent and good flatness using the mask blank substrate 1, 1c.

The transfer mask of this embodiment is applied to the above-mentioned binary transfer mask, a dug-down- or an engraved-type Levenson phase shift mask, halftone phase shift mask, enhancer phase shift mask, or the like.

[Embodiment of Reflective Mask and its Manufacturing Method]

A reflective mask of this embodiment has a structure in which a transfer pattern is formed in the absorber film of the above-mentioned reflective mask blank. Using the above-mentioned reflective mask blank, this reflective mask can achieve excellent and good flatness.

Next, a reflective mask manufacturing method of this embodiment is a method of forming a transfer pattern in the absorber film of the reflective mask blank obtained by the reflective mask blank manufacturing method of the above-mentioned embodiment.

Specifically, the reflective mask manufacturing method usually comprises a process of preparing the reflective mask blank obtained by the above-mentioned reflective mask blank manufacturing method, a pattern forming process of forming a resist film on the absorber film by spin coating or the like and exposing/writing a transfer pattern on the resist film, thereby forming a desired resist pattern through development and so on, and an absorber pattern forming process of removing the absorber film by etching using the resist pattern as a mask, thereby forming a transfer pattern in the absorber film.

According to this reflective mask manufacturing method, it is possible to achieve excellent and good flatness using the mask blank substrate 1, 1c.

EXAMPLES

Example 1

First, there was prepared a substrate 1c made of $TiO_2$—$SiO_2$ with a low thermal expansion coefficient, having a substantially square plan-view shape, and having a length of each side of about 152 mm (6 inches) and a thickness of 6.35 mm (0.25 inches).

In a substrate mark forming process, the substrate 1c was formed with R-surfaces 102, chamfered surfaces 103, and substrate marks 4c (see FIG. 2). The R-surfaces 102 were curved surfaces formed at four corners of the substrate 1c and each having a radius of curvature of 2.5 mm. The chamfered surfaces 103 were formed along the edges of main surfaces 111 and 112 and each had a chamfer width of 0.5 mm. In the substrate 1c, the main surface 111 was on the side where a multilayer reflective film and an absorber film were to be formed while the main surface 112 was on the side where a conductive film was to be formed.

The substrate marks 4c were formed at an upper-right corner and a lower-left corner in FIG. 2 and each substrate mark was in the form of an oblique section (single oblique section) obtained by cutting off the R-surface 102 and the chamfered surface 103 between the main surface 112 and side surfaces 110 (including the R-surface 102). Each substrate mark 4c had a curved boundary 41c crossing the chamfered surface 103. The boundary 41c was formed so as to be located on the outer peripheral side than the boundary between the main surface 112 and the chamfered surface 103.

The distance $W_2$ from the boundary 41c between the substrate mark 4c and the chamfered surface 103 to the boundary between the substrate mark 4c and the R-surface 102 (this distance $W_2$ was a distance on a virtual plane including the vicinity of the central portion of the main surface 112 and was the maximum value of the distances from arbitrary points of the boundary 41c to the boundary between the substrate mark 4c and the R-surface 102 in a direction perpendicular to the line (tangent) of the boundary 41c) was set to about 0.4 mm. Further, the maximum value $H_2$ of the heights from the virtual plane including the vicinity of the central portion of the main surface 112 to the boundary between the substrate mark 4c and the R-surface 102 in a side surface direction was set to about 1.5 mm and the inclination angle $\theta_2$ of the substrate mark 4c with respect to the main surface 112 was set to about 75°. That is, the maximum height value $H_2$ of the illustrated substrate mark 4c was 23% or more of the thickness (6.35 mm).

The substrate marks 4c were formed by grinding using a diamond whetstone or the like and then were mirror-finished.

Subsequently, the substrate 1c was subjected to grinding by a double-sided lapping machine.

Then, in a polishing process, the substrate 1c formed with the substrate marks 4c was subjected to polishing (rough polishing, precision polishing, and ultra-precision polishing) using the above-mentioned double-sided polishing machine.

(1) Rough Polishing Process 10 substrates 1c subjected to the grinding were set in a double-sided polishing machine and subjected to a rough polishing process under the following polishing conditions. This polishing was carried out 10 times so that the rough polishing process was carried out for a total of 100 substrates 1c. The processing load and the polishing time were properly adjusted.

Polishing Liquid: cerium oxide (average particle size 2 to 3 μm)+water

Polishing Pad: hard polisher (urethane pad)

After the rough polishing process, the substrates 1c were immersed in a cleaning bath (ultrasonic wave was applied) so as to be cleaned for removing polishing abrasive particles adhering to the substrates 1c.

(2) Precision Polishing Process 10 substrates 1c subjected to the rough polishing process were set in a double-sided polishing machine and subjected to a precision polishing process under the following polishing conditions. This polishing was carried out 10 times so that the precision polishing process was carried out for a total of 100 substrates 1c. The processing load and the polishing time were properly adjusted.

Polishing Liquid: cerium oxide (average particle size 1 μm)+water

Polishing Pad: soft polisher (suede type)

After the precision polishing process, the substrates 1c were immersed in a cleaning bath (ultrasonic wave was applied) so as to be cleaned for removing polishing abrasive particles adhering to the substrates 1c.

(3) Ultra-Precision Polishing Process 10 substrates 1c subjected to the precision polishing process were set in a double-sided polishing machine and subjected to an ultra-precision polishing process under the following polishing conditions. This polishing was carried out 10 times so that the ultra-precision polishing process was carried out for a total of 100 substrates 1c. The processing load and the polishing time were properly adjusted so as to achieve a required flatness (desired flatness: 0.1 μm or less).

Polishing Liquid: colloidal silica (average particle size 30 to 200 nm)+water

Polishing Pad: super-soft polisher (suede type)

After the ultra-precision polishing process, the substrates 1c were immersed in a cleaning bath (ultrasonic wave was applied) filled with a cleaning liquid containing hydrofluoric acid and hydrofluosilicic acid so as to be cleaned for removing polishing abrasive particles adhering to the substrates 1c.

(Measurement Result)

Figure 3:
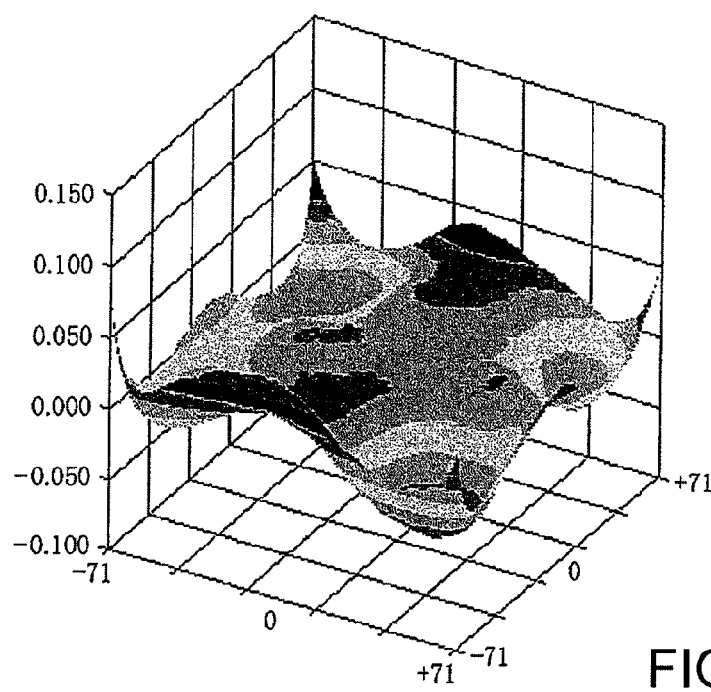
FIG. 3 shows the results obtained by measuring the surface shape of a main surface of a mask blank substrate according to Example 1 of this invention.

The surface shape (flatness) of the main surface 111 of the cleaned substrate 1c was measured using an optical interference type flatness measuring apparatus (UltraFLAT200M manufactured by Corning TROPEL Corporation). The measured surface shape distribution of the main surface 111 is shown in FIG. 3. The surface shape distribution of FIG. 3 was obtained in a 142 mm×142 mm square region with respect to the center of the main surface 111 of the substrate (hereinafter the same shall apply to Comparative Examples). The flatness in a 132 mm×132 mm square region with respect to the center of the main surface 111 of the substrate 1c was about 0.065 µm, i.e. a good result.

Figure 4:
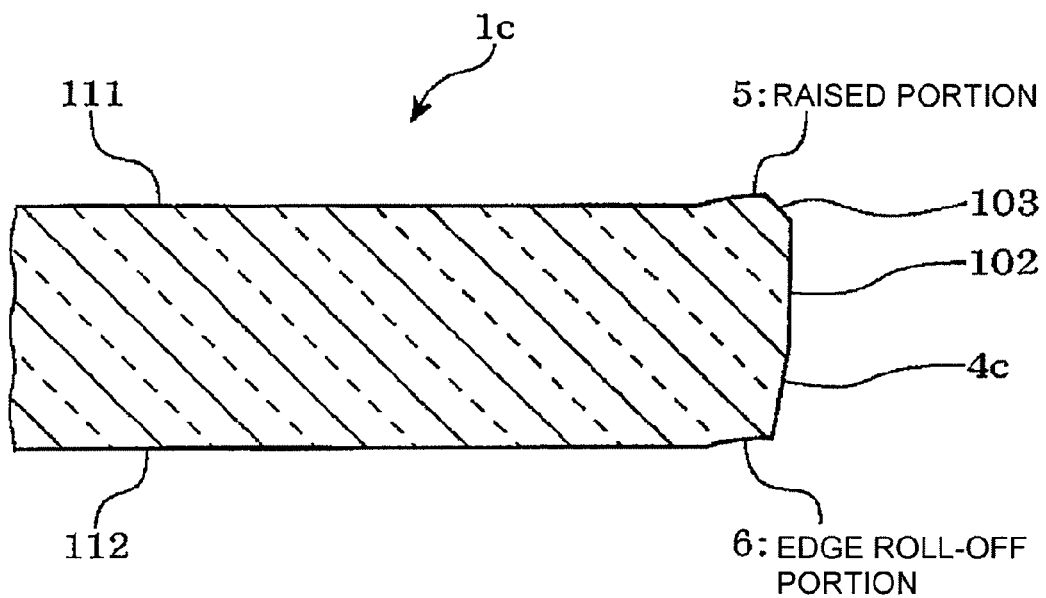
FIG. 4 shows a schematic enlarged cross-sectional view of a main portion of the mask blank substrate according to the Example 1 of this invention.

In the surface shape distribution of the main surface 111 in FIG. 3, the shapes in the vicinity of the R-surfaces 102 at the four corners of the substrate 1c were all somewhat convex (raised portions 5 were formed), but variation in the height of the convex shapes was very small among the four corners (see FIG. 4). The surface shape distribution on the main surface 112 side was also measured in the same manner. As a result, edge roll-off portions 6 were somewhat formed in all the shapes in the vicinity of the R-surfaces 102 at the four corners of the substrate 1c, but variation in the height level of the edge roll-off portions 6 was very small among the four corners. Further, the flatness in a 132 mm×132 mm square region with respect to the center of the main surface 112 was also good like the main surface 111.

Although the measurement results of the surface shape distribution of the substrate 1c were good, the flatness of each of the main surfaces 111 and 112 in the 132 mm×132 mm square region with respect to the center of the main surface 111 (main surface 112) did not satisfy a flatness of 0.05 µm or less in a 132 mm×132 mm square region required for a mask blank substrate for use in the manufacture of a reflective mask blank for use with EUV light as exposure light. Therefore, in order to satisfy the required flatness, a local processing process was carried out. Specifically, first, based on the measured surface shape distribution data of the main surfaces 111 and 112, the positions and required processing amounts were calculated with respect to convex portions to be locally processed for satisfying the required flatness. Then, the substrate 1c was set in and the information about the positions and required processing amounts of the convex portions was input into an MRF processing machine adapted to carry out local processing using a magnetic fluid, thereby locally processing the main surfaces 111 and 112. The time required for the processing was significantly shortened as compared to the case of the substrate having the conventional substrate mark shape.

Then, using a polishing liquid containing colloidal silica abrasive particles, extremely short time polishing for restoring the surface roughness (0.15 nm or less in Rq) was carried out on the main surfaces 111 and 112 of the substrate 1c after the local processing by a double-sided polishing machine. The time required for restoring the surface roughness was also shortened as compared to the case of the substrate having the conventional substrate mark shape. Finally, predetermined cleaning and so on were carried out, thereby obtaining a mask blank substrate 1c usable in the manufacture of a reflective mask blank.

Then, on the main surface 112 of the obtained mask blank substrate 1c, a CrN film was formed as a conductive film to a thickness of 30 nm by sputtering. In this event, the conductive film was not formed in an outer peripheral region (at least the chamfered surface 103) of the main surface 112. Then, the mask blank substrate 1c formed with the conductive film was electrostatically chucked on a rotary stage of an ion-beam sputtering apparatus, thereby forming a Si/Mo multilayer reflective film by ion-beam sputtering. Specifically, a Si film was formed to 4.2 nm and a Mo film was formed to 2.8 nm and, given that this formed one cycle, Si and Mo films were laminated by 40 cycles, then finally a Si film was formed to 4 nm. Then, a protective film made of RuNb was formed to a thickness of 2.5 nm on the Si film of the multilayer reflective film. Further, an absorber film having a laminated structure of a lower layer made of TaN and an upper layer made of TaO was formed on the protective film, thereby obtaining a reflective mask blank.

Then, a resist film for electron beam exposure was formed by spin coating on the absorber film of the obtained reflective mask blank. Electron beam writing and development were applied to the resist film, thereby forming a resist pattern having a transfer pattern. Dry etching with a $CF_4$ gas was carried out using the resist pattern as a mask, thereby forming a transfer pattern in the upper layer of the absorber film. Further, dry etching with a $Cl_2$ gas was carried out using the resist pattern and the transfer pattern of the upper layer as a mask, thereby forming a transfer pattern in the lower layer of the absorber film. Then, the resist pattern was stripped and predetermined cleaning was carried out, thereby obtaining a reflective mask.

The obtained reflective mask was fixed by electrostatic chucking on a mask stage of an exposure apparatus, thereby carrying out exposure/transfer onto a resist film on a semiconductor wafer using EUV light as exposure light. Predetermined development and so on were applied to the resist film after the exposure/transfer. Then, using this resist film as a mask, dry etching was applied to a thin film on the semiconductor wafer, thereby forming a circuit pattern. The circuit pattern formed on the semiconductor wafer was observed by TEM and, as a result, it was confirmed that the circuit pattern was formed with high accuracy. This result largely depends on high flatness of the substrate 1c of the used reflective mask.

Comparative Example 1

Compared to Example 1, Comparative Example 1 differs in that the above-mentioned substrate mark 104 was formed instead of each of the substrate marks 44c. The processing conditions and so on of a polishing process and so on of the Comparative Example were substantially the same as those in Example 1.

Therefore, with respect to the same contents as those in Example 1, a detailed description thereof will be omitted.

Substrate marks 104 were formed at an upper-right corner and a lower-left corner in FIG. 8 and each was in the form of an oblique section (single oblique section) obtained by cutting off a main surface 112, an R-surface 102, two side surfaces 110 continuous with the R-surface 102, and a chamfered surface 103 between the main surface 112 and the side surfaces 110 (including the R-surface 102). Each substrate mark 104 had a line boundary 141 crossing the main surface 112 and this boundary 141 was, as seen from above, perpendicular to a diagonal passing through the R-surface 102.

The distance $W_0$ from the boundary 141 between the substrate mark 104 and the main surface 112 to the boundary between the substrate mark 104 and the R-surface 102 (this distance $W_0$ was a distance on a virtual plane including the vicinity of the central portion of the main surface 112 and was the maximum value of the distances from arbitrary points of the boundary 141 to the boundary between the substrate mark 104 and the R-surface 102 in a direction perpendicular to the line of the boundary 141) was set to about 3.0 mm. Further, the maximum value $H_0$ of the heights from the virtual plane including the vicinity of the central portion of the main surface 112 to the boundary between the substrate mark 104 and the R-surface 102 in a side surface direction was set to about 1.2 mm and the inclination angle $θ_0$ of the substrate mark 104 with respect to the main surface 112 was set to about 22°. That is, the maximum height value $H_0$ was less than 19% of the substrate thickness.

The substrate marks 104 were formed by grinding using a diamond whetstone or the like and then were mirror-finished.

Subsequently, the substrate 101 was subjected to grinding by a double-sided lapping machine.

Then, in a polishing process, the substrate 101 formed with the substrate marks 104 was subjected to polishing (rough polishing, precision polishing, and ultra-precision polishing) using a double-sided polishing machine in the same manner as in Example 1.

Subsequently, after the ultra-precision polishing process, the substrate 101 was immersed in a cleaning bath (ultrasonic wave was applied) filled with a cleaning liquid containing hydrofluoric acid and hydrofluosilicic acid so as to be cleaned for removing polishing abrasive particles adhering to the glass substrate.

(Measurement Result)

Figure 5:
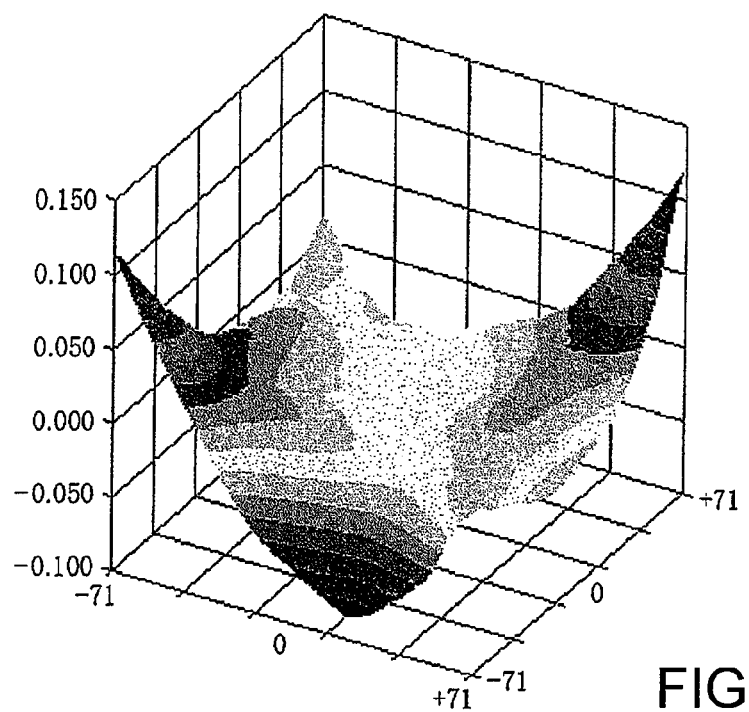
FIG. 5 shows the results obtained by measuring the surface shape of a main surface of a mask blank substrate according to Comparative Example 1 of this invention.

The surface shape (flatness) of the cleaned substrate 101 was measured using an optical interference type flatness measuring apparatus (UltraFLAT200M manufactured by Corning TROPEL Corporation). The measured surface shape distribution of a main surface 111 is shown in FIG. 5. The flatness in a 132 mm×132 mm square region with respect to the center of the main surface 111 of the substrate 101 was about 0.168 µm, i.e. a very bad result.

In the surface shape distribution of the main surface 111 in FIG. 5, the shapes in the vicinity of the R-surfaces 102 at the two corners, where the substrate marks 104 were formed, of the substrate 101 had larger and higher convex shapes (raised portions 105 were formed) compared to the shapes in the vicinity of the R-surfaces 102 at the other two corners where the substrate mark 104 was not formed. Variation in the height of the convex shapes was very large among the four corners. The surface shape distribution on the main surface 112 side was also measured in the same manner. As a result, the shapes in the vicinity of the R-surfaces 102 at the two corners where the substrate marks 104 were formed were largely edge roll-off compared to the shapes in the vicinity of the R-surfaces 102 at the other two corners and variation in the height level of edge roll-off portions 106 was also very large among the four corners. Further, the flatness in a 132 mm×132 mm square region with respect to the center of the main surface 112 was also not good like the main surface 111.

Comparative Example 2

Compared to Comparative Example 1, Comparative Example 2 differs only in that substrate marks 104 were formed at all four corners in FIG. 8, that the distance $W_0$ from the boundary 141 between the substrate mark 104 and a main surface 112 to the boundary between the substrate mark 104 and an R-surface 102 was set to about 2.4 mm, that the maximum value $H_0$ of the heights from a virtual plane including the vicinity of the central portion of the main surface 112 to the boundary between the substrate mark 104 and the R-surface 102 in a side surface direction was set to about 1.1 mm, and that the inclination angle $θ_0$ of the substrate mark 104 with respect to the main surface 112 was set to about 25°. That is, the maximum height value $H_0$ of the substrate mark 104 in Comparative Example 2 was 17% or more of the substrate thickness.

(Measurement Result)

Figure 6:
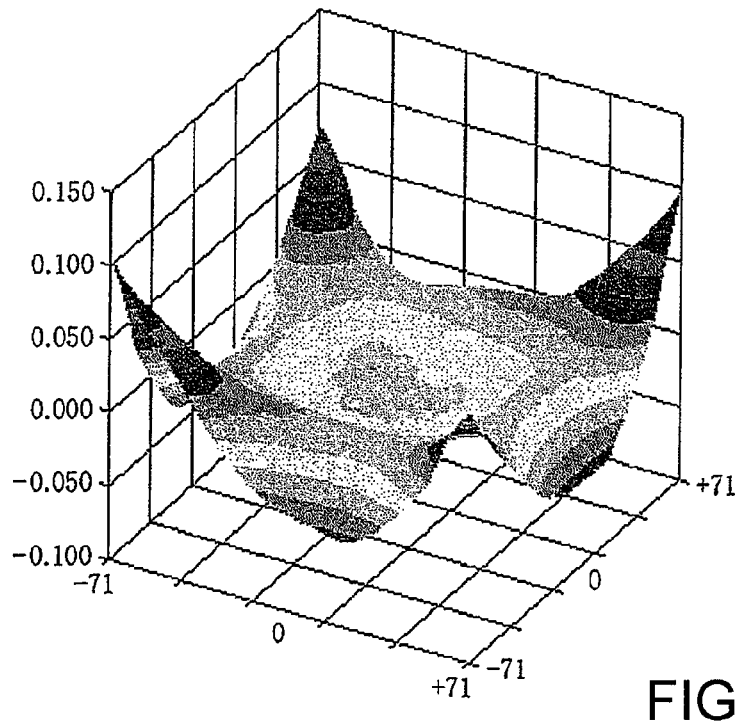
FIG. 6 shows the results obtained by measuring the surface shape of a main surface of a mask blank substrate according to Comparative Example 2 of this invention.

After a polishing process was carried out in the same manner as in Comparative Example 1, the surface shape (flatness) of a cleaned substrate 101 was measured using an optical interference type flatness measuring apparatus (UltraFLAT200M manufactured by Corning TROPEL Corporation). The measured surface shape distribution of a main surface 111 is shown in FIG. 6. The flatness in a 132 mm×132 mm square region with respect to the center of the main surface 111 of the substrate 101 was about 0.116 µm.

In the surface shape distribution of the main surface 111 in FIG. 6, the shapes in the vicinity of the R-surfaces 102 at the four corners of the substrate 101 were all convex (raised portions 105 were formed), but variation in the height of the convex shapes was very small among the four corners. The surface shape distribution on the main surface 112 side was also measured in the same manner. As a result, edge roll-off portions 106 were formed in all the shapes in the vicinity of the R-surfaces 102 at the four corners of the substrate 101 but variation in the height level of the edge roll-off portions 106 was very small among the four corners. The flatness of each of the main surfaces 111 and 112 in the 132 mm×132 mm square region was better than Comparative Example 1, but was not good in comparison with Example 1.

Comparative Example 3

Compared to Comparative Example 2, Comparative Example 3 differs in that substrate marks 104 were formed only at an upper-right corner and a lower-left corner in FIG. 8.

(Measurement Result)

Figure 7:
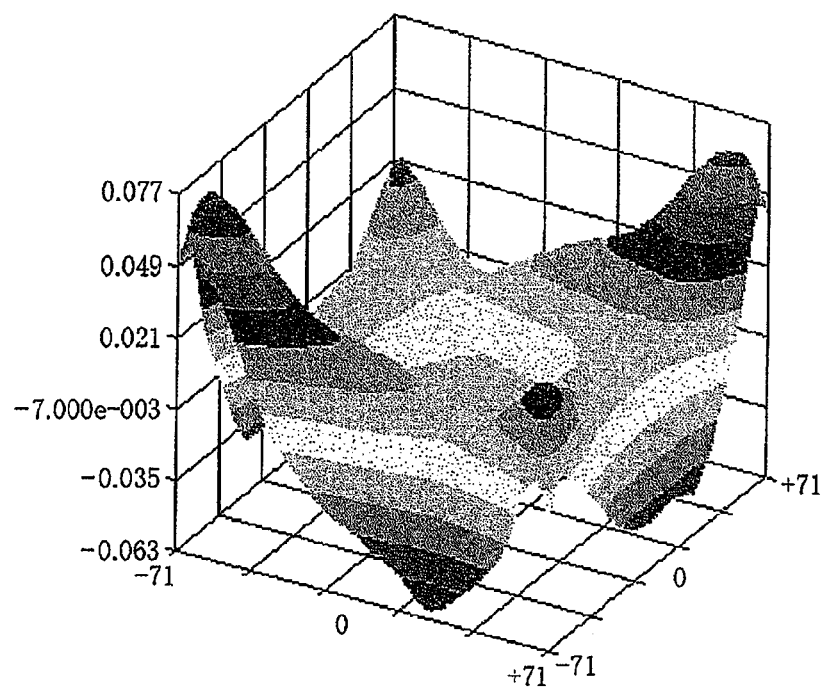
FIG. 7 shows the results obtained by measuring the surface shape of a main surface of a mask blank substrate according to Comparative Example 3 of this invention.

After a polishing process was carried out in the same manner as in Comparative Example 2, the surface shape (flatness) of a cleaned substrate 101 was measured using an optical interference type flatness measuring apparatus (UltraFLAT200M manufactured by Corning TROPEL Corporation). The measured surface shape distribution of a main surface 111 is shown in FIG. 7. The flatness in a 132 mm×132 mm square region with respect to the center of the main surface 111 of the substrate 101 was about 0.111 µm.

In the surface shape distribution of the main surface 111 in FIG. 7, the shapes in the vicinity of R-surfaces 102 at the two corners, where the substrate marks 104 were formed, of the substrate 101 had larger and higher convex shapes (raised portions 105 were formed) compared to the shapes in the vicinity of R-surfaces 102 at the other two corners where the substrate mark 104 was not formed. Variation in the height of the convex shapes was large among the four corners. The surface shape distribution on the main surface 112 side was also measured in the same manner. As a result, the shapes in the vicinity of the R-surfaces 102 at the two corners where the substrate marks 104 were formed were largely edge roll-off compared to the shapes in the vicinity of the R-surfaces 102 at the other two corners and variation in the height level of edge roll-off portions 106 was also large among the four corners. The flatness of each of the main surfaces 111 and 112 in the 132 mm×132 mm square region was better than Comparative Example 1, but was not good compared to Example 1.

Example 2

Compared to Example 1, Example 2 differs only in that the distance $W_1$ from the boundary 41 between a substrate mark 4 and a main surface 112 to the boundary between the substrate mark 4 and an R-surface 102 was set to about 0.9 mm, that the maximum value $H_1$ of the heights from a virtual plane including the vicinity of the central portion of the main surface 112 to the boundary between the substrate mark 4 and the R-surface 102 in a side surface direction was set to about 2.0 mm, and that the inclination angle $\theta_1$ of the substrate mark 4 with respect to the main surface 112 was set to about 66°. That is, the maximum height value $H_1$ of the substrate mark 4 was 31% or more.

(Measurement Result)

Figure 10:
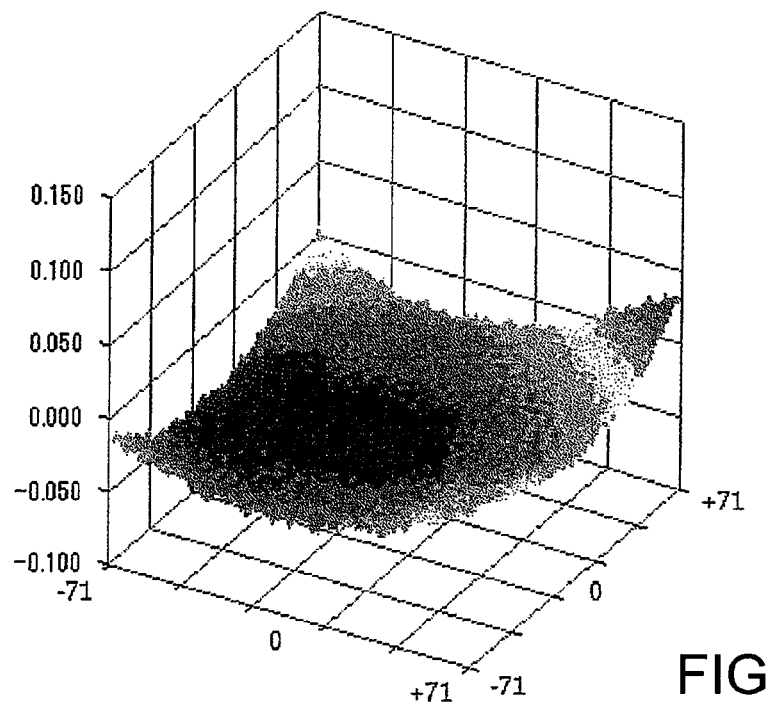
FIG. 10 shows the results obtained by measuring the surface shape of a main surface of a mask blank substrate according to Example 2 of this invention.

After a polishing process was carried out in the same manner as in Example 1, the surface shape (flatness) of a cleaned substrate 1 was measured using an optical interference type flatness measuring apparatus (UltraFLAT200M manufactured by Corning TROPEL Corporation). The measured surface shape distribution of a main surface 111 is shown in FIG. 10. The flatness in a 132 mm×132 mm square region with respect to the center of the main surface 111 of the substrate 1 was about 0.075 μm.

In the surface shape distribution of the main surface 111 in FIG. 10, the shapes in the vicinity of the R-surfaces 102 at four corners of the substrate 1 were all slightly convex, but variation in the height of the convex shapes was very small among the four corners. The surface shape distribution on the main surface 112 side was also measured in the same manner. As a result, edge roll-off portions were somewhat formed in all the shapes in the vicinity of the R-surfaces 102 at the four corners of the substrate 1, but variation in the height level of the edge roll-off portions was very small among the four corners. Further, the flatness in a 132 mm×132 mm square region with respect to the center of the main surface 112 was also good like the main surface 111.

Although the measurement results of the surface shape distribution of the substrate 1 were good, the flatness of each of the main surfaces 111 and 112 in the 132 mm×132 mm square region with respect to the center of the main surface 111 (main surface 112) did not satisfy a flatness of 0.05 μm or less in a 132 mm×132 mm square region required for a mask blank substrate for use in the manufacture of a reflective mask blank for use with EUV light as exposure light. Therefore, in order to satisfy the required flatness, a local processing process was carried out in the same manner as in Example 1. The time required for the local processing was significantly shortened as compared to the case of the substrate having the conventional substrate mark shape.

Then, using a polishing liquid containing colloidal silica abrasive particles, extremely short time polishing for restoring the surface roughness (0.15 nm or less in Rq) was carried out on the main surfaces 111 and 112 of the substrate 1 after the local processing by a double-sided polishing machine. The time required for restoring the surface roughness was also shortened compared to the case of the substrate having the conventional substrate mark shape. Finally, predetermined cleaning and so on were carried out, thereby obtaining a mask blank substrate 1 usable in the manufacture of a reflective mask blank.

Then, using the obtained mask blank substrate 1, a reflective mask blank of Example 2 was obtained in the same manner as in Example 1. Further, using the obtained reflective mask blank, a reflective mask of Example 2 was obtained in the same manner as in Example 1. The obtained reflective mask of Example 2 was fixed by electrostatic chucking on a mask stage of an exposure apparatus, thereby carrying out exposure/transfer onto a resist film on a semiconductor wafer using EUV light as exposure light. Predetermined development and so on were applied to the resist film after the exposure/transfer. Then, using this resist film as a mask, dry etching was applied to a thin film on the semiconductor wafer, thereby forming a circuit pattern. The circuit pattern formed on the semiconductor wafer was observed by TEM and, as a result, it was confirmed that the circuit pattern was formed with high accuracy. This result largely depends on high flatness of the substrate 1 of the used reflective mask.

Example 3

Compared to Example 1, Example 3 differs only in that the distance $W_1$ from the boundary 41 between a substrate mark 4 and a main surface 112 to the boundary between the substrate mark 4 and an R-surface 102 was set to about 1.4 mm, that the maximum value $H_1$ of the heights from a virtual plane including the vicinity of the central portion of the main surface 112 to the boundary between the substrate mark 4 and the R-surface 102 in a side surface direction was set to about 1.5 mm, and that the inclination angle $\theta_1$ of the substrate mark 4 with respect to the main surface 112 was set to about 47°. The maximum height value $H_1$ of the substrate mark 4 according to Example 3 was 23% or more.

(Measurement Result)

Figure 11:
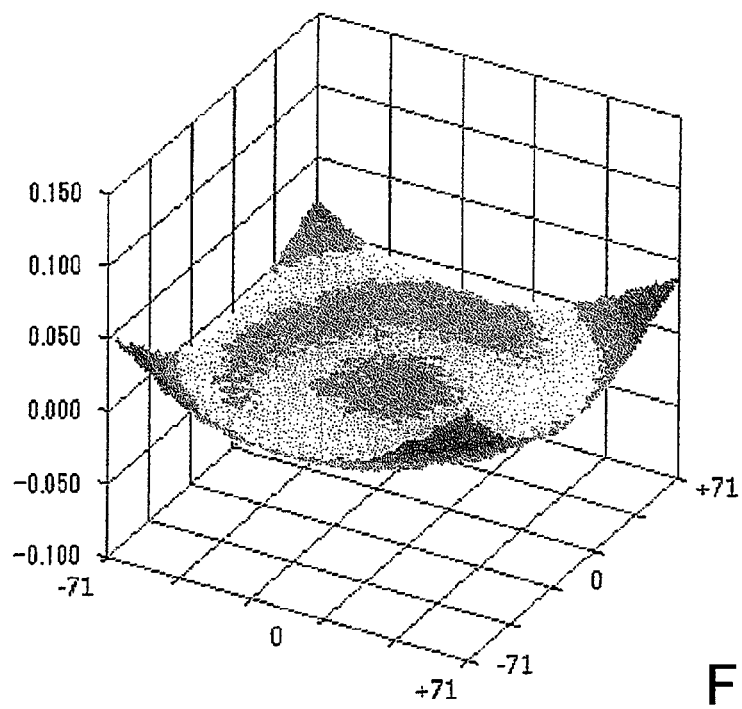
FIG. 11 shows the results obtained by measuring the surface shape of a main surface of a mask blank substrate according to Example 3 of this invention.

After a polishing process was carried out in the same manner as in Example 1, the surface shape (flatness) of a cleaned substrate 1 was measured using an optical interference type flatness measuring apparatus (UltraFLAT200M manufactured by Corning TROPEL Corporation). The measured surface shape distribution of a main surface 111 is shown in FIG. 11. The flatness in a 132 mm×132 mm square region with respect to the center of the main surface 111 of the substrate 1 was about 0.080 μm.

In the surface shape distribution of the main surface 111 in FIG. 11, the shapes in the vicinity of the R-surfaces 102 at four corners of the substrate 1 were all somewhat convex, but variation in the height of the convex shapes was very small among the four corners. The surface shape distribution on the main surface 112 side was also measured in the same manner. As a result, edge roll-off portions were somewhat formed in all the shapes in the vicinity of the R-surfaces 102 at the four corners of the substrate 1, but variation in the height level of the edge roll-off portions was very small among the four corners. Further, the flatness in a 132 mm×132 mm square region with respect to the center of the main surface 112 was also good like the main surface 111.

Although the measurement results of the surface shape distribution of the substrate 1 were good, the flatness of each of the main surfaces 111 and 112 in the 132 mm×132 mm square region with respect to the center of the main surface 111 (main surface 112) did not satisfy a flatness of 0.05 μm or less in a 132 mm×132 mm square region required for a mask blank substrate for use in the manufacture of a reflective mask blank for use with EUV light as exposure light. Therefore, in order to satisfy the required flatness, a local processing process was carried out in the same manner as in Example 1. The time required for the local processing was significantly shortened compared to the case of the substrate having the conventional substrate mark shape.

Then, using a polishing liquid containing colloidal silica abrasive particles, extremely short time polishing for restoring the surface roughness (0.15 nm or less in Rq) was carried out on the main surfaces 111 and 112 of the substrate 1 after the local processing by a double-sided polishing machine. The time required for restoring the surface roughness was also shortened compared to the case of the substrate having the conventional substrate mark shape. Finally, predetermined cleaning and so on were carried out, thereby obtaining a mask blank substrate 1 usable in the manufacture of a reflective mask blank.

Then, using the obtained mask blank substrate 1, a reflective mask blank of Example 3 was obtained in the same manner as in Example 1. Further, using the obtained reflective mask blank, a reflective mask of Example 3 was obtained in the same manner as in Example 1. The obtained reflective mask of Example 3 was fixed by electrostatic chucking on a mask stage of an exposure apparatus, thereby carrying out exposure/transfer onto a resist film on a semiconductor wafer using EUV light as exposure light. Predetermined development and so on were applied to the resist film after the exposure/transfer. Then, using this resist film as a mask, dry etching was applied to a thin film on the semiconductor wafer, thereby forming a circuit pattern. The circuit pattern formed on the semiconductor wafer was observed by TEM and, as a result, it was confirmed that the circuit pattern was formed with high accuracy. This result largely depends on high flatness of the substrate 1 of the used reflective mask.

While the mask blank substrate, the mask blank, the reflective mask blank, the transfer mask, the reflective mask, and the methods of manufacturing them according to this invention have been described with reference to the preferred embodiments and so on, the mask blank substrate, the mask blank, the reflective mask blank, the transfer mask, the reflective mask, and the methods of manufacturing them according to this invention are not limited to the above-mentioned embodiments and so on. It is needless to say that various changes can be made within the scope of this invention.

For example, the substrate mark 4, 4c composed of the single oblique section is formed at one corner of the mask blank substrate 1, 1c, but not limited to this. For example, although not illustrated, a substrate mark composed of two or more oblique sections may be formed at one corner and, further, may be used jointly with a film mark or the like. This makes it possible to improve discrimination capability.

Further, in the above-mentioned embodiments and Examples, the description has been given of the square mask blank substrate having a length of each side of 152 mm and a thickness of 6.35 mm. However, this invention is by no means limited thereto and can also be applied to an oblong mask blank substrate in the same manner.

DESCRIPTION OF SYMBOLS 1, 1c, 101 mask blank substrate
4, 4a, 4b, 4c, 104 substrate mark
5, 105 raised portion
6, 106 edge roll-off portion
21 polishing pad
41, 141 boundary
102 R-surface
103 chamfered surface
110 side surface
111, 112 main surface
211 convex portion

The invention claimed is:

1. A mask blank substrate which is a thin sheet-like substrate comprising: two main surfaces; four side surfaces; an R-surface formed between the adjacent side surfaces; and a chamfered surface formed between the main surface and the side surfaces,
wherein the substrate has a substrate mark of an oblique section shape formed across the main surface or the chamfered surface and the R-surface, and
wherein the substrate mark is such that a maximum value of a distance is less than 1.5 mm, where the distance is measured on a virtual plane including a central portion of the main surface and measured from an arbitrary point on a boundary line between the substrate mark and the main surface or the chamfered surface to a boundary between the substrate mark and the R-surface is in a direction perpendicular to the boundary line.

2. The mask blank substrate according to claim 1, wherein the substrate mark has an inclination angle of greater than 45° and less than 90° with respect to the main surface.

3. A mask blank comprising, on the main surface of the mask blank substrate according to claim 1, a thin film for forming a transfer pattern.

4. A transfer mask comprising a transfer pattern formed in the thin film of the mask blank according to claim 3.

5. A reflective mask blank comprising, on the main surface of the mask blank substrate according to claim 1, a multilayer reflective film and an absorber film serving as a thin film for forming a transfer pattern.

6. A reflective mask comprising a transfer pattern formed in the absorber film of the reflective mask blank according to claim 5.

7. The mask blank substrate according to claim 1, wherein the substrate mark is formed on one side of the main surface opposite to the other side of the main surface on which a thin film having a transfer pattern is to be formed.

8. A mask blank substrate which is a thin sheet-like substrate comprising: two main surfaces; four side surfaces; an R-surface formed between the adjacent side surfaces; and a chamfered surface formed between the main surface and the side surfaces,
wherein the substrate has a substrate mark of an oblique section shape formed across the main surface or the chamfered surface and the R-surface, and
wherein the substrate mark is such that a boundary between the substrate mark and the main surface or the chamfered surface is located on a boundary between the main surface and the chamfered surface or on a peripheral area placed outside of the boundary between the main surface and the chamfered surface and an inclination angle of the substrate mark with respect to the main surface is greater than 45° and less than 90°.

9. The mask blank substrate according to claim 8, wherein the substrate mark is formed on one side of the main surface opposite to the other side of the main surface on which a thin film having a transfer pattern is to be formed.

10. A mask blank comprising, on the main surface of the mask blank substrate according to claim 8, a thin film for forming a transfer pattern.

11. A transfer mask comprising a transfer pattern formed in the thin film of the mask blank according to claim 10.

12. A reflective mask blank comprising, on the main surface of the mask blank substrate according to claim 8, a multilayer reflective film and an absorber film serving as a thin film for forming a transfer pattern.

13. A reflective mask comprising a transfer pattern formed in the absorber film of the reflective mask blank according to claim 12.

14. A method of manufacturing a mask blank substrate, comprising:
a substrate mark forming step of, with respect to a thin sheet-like substrate comprising two main surfaces, four side surfaces, an R-surface formed between the adjacent side surfaces, and a chamfered surface formed between the main surface and the side surfaces, forming a substrate mark of an oblique section shape across the chamfered surface and the R-surface; and
a polishing step of polishing both main surfaces of the substrate using a polishing liquid containing polishing abrasive particles,
wherein the substrate mark is formed so that a boundary between the substrate mark and the main surface or the chamfered surface is located on a boundary between the main surface and the chamfered surface or on a peripheral area placed outside of the boundary between the main surface and the chamfered surface and an inclination angle of the substrate mark with respect to the main surface is greater than 45° and less than 90°.

15. The method of manufacturing a mask blank substrate according to claim 14, wherein the substrate mark is formed on one side of the main surface opposite to the other side of the main surface on which a thin film having a transfer pattern is to be formed.

16. A method of manufacturing a mask blank, comprising providing a thin film for forming a transfer pattern, on the main surface of the mask blank substrate obtained by the method of manufacturing a mask blank substrate according to claim 14.

17. A method of manufacturing a transfer mask, comprising forming a transfer pattern in the thin film of the mask blank obtained by the method of manufacturing a mask blank according to claim 16.

18. A method of manufacturing a reflective mask blank, comprising providing a multilayer reflective film and an absorber film serving as a thin film for forming a transfer pattern, on the main surface of the mask blank substrate obtained by the method of manufacturing a mask blank substrate according to claim 14.

19. A method of manufacturing a reflective mask, comprising forming a transfer pattern in the absorber film of the mask blank obtained by the method of manufacturing a reflective mask blank according to claim 18.

20. A method of manufacturing a mask blank substrate, comprising:
a substrate mark forming step of, with respect to a thin sheet-like substrate comprising two main surfaces, four side surfaces, an R-surface formed between the adjacent side surfaces, and a chamfered surface formed between the main surface and the side surfaces, forming a substrate mark of an oblique section shape across the main surface or the chamfered surface and the R-surface; and
a polishing step of polishing both main surfaces of the substrate using a polishing liquid containing polishing abrasive particles,
wherein the substrate mark is formed so that a maximum value of a distance is less than 1.5 mm, where the distance is measured on a virtual plane including a central portion of the main surface and measured from an arbitrary point on a boundary line between the substrate mark and the main surface or the chamfered surface to a boundary between the substrate mark and the R-surface in a direction perpendicular to the boundary line.

21. The method of manufacturing a mask blank substrate according to claim 20, wherein the substrate mark is formed so as to have an inclination angle of greater than 45° and less than 90° with respect to the main surface.

22. A method of manufacturing a mask blank, comprising providing a thin film for forming a transfer pattern, on the main surface of the mask blank substrate obtained by the method of manufacturing a mask blank substrate according to claim 20.

23. A method of manufacturing a transfer mask, comprising forming a transfer pattern in the thin film of the mask blank obtained by the method of manufacturing a mask blank according to claim 22.

24. A method of manufacturing a reflective mask blank, comprising providing a multilayer reflective film and an absorber film serving as a thin film for forming a transfer pattern, on the main surface of the mask blank substrate obtained by the method of manufacturing a mask blank substrate according to claim 20.

25. A method of manufacturing a reflective mask, comprising forming a transfer pattern in the absorber film of the mask blank obtained by the method of manufacturing a reflective mask blank according to claim 24.

26. The method of manufacturing a mask blank substrate according to claim 20, wherein the substrate mark is formed on one side of the main surface opposite to the other side of the main surface on which a thin film having a transfer pattern is to be formed.

* * * * *